(12) United States Patent
Won et al.

(10) Patent No.: US 12,406,888 B2
(45) Date of Patent: Sep. 2, 2025

(54) SEMICONDUCTOR SUBSTRATE AND METHOD OF DICING THE SAME

(71) Applicant: SAMSUNG ELECTRONICS CO., LTD., Suwon-si (KR)

(72) Inventors: Donghoon Won, Cheonan-si (KR); Jaeeun Lee, Suwon-si (KR); Yeongkwon Ko, Suwon-si (KR); Junyeong Heo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 692 days.

(21) Appl. No.: 16/871,189

(22) Filed: May 11, 2020

(65) Prior Publication Data

US 2021/0050264 A1    Feb. 18, 2021

(30) Foreign Application Priority Data

Aug. 16, 2019    (KR) .................. 10-2019-0100527

(51) Int. Cl.
*H01L 21/78*    (2006.01)
*H01L 21/268*    (2006.01)
(Continued)

(52) U.S. Cl.
CPC ............. *H01L 21/78* (2013.01); *H01L 21/268* (2013.01); *H01L 23/562* (2013.01); *H01L 23/585* (2013.01)

(58) Field of Classification Search
CPC ........ H01L 21/78; H01L 23/585; B23K 26/53
See application file for complete search history.

(56) References Cited

U.S. PATENT DOCUMENTS 7,382,038 B2    6/2008    Wu
8,076,756 B2    12/2011    Lane et al.
(Continued)

FOREIGN PATENT DOCUMENTS

CN         101297394 A    10/2008
DE    10 2018 206 303 A1    10/2018
(Continued)

OTHER PUBLICATIONS

Notice of Allowance issued Jun. 29, 2025 by the Korean Patent Office for KR Patent Application No. 10-2019-0100527.
(Continued)

*Primary Examiner* — Erik T. K. Peterson
(74) *Attorney, Agent, or Firm* — Sughrue Mion, PLLC

(57) ABSTRACT

There is provided a method of dicing a semiconductor wafer, which includes providing a semiconductor substrate having a plurality of integrated circuit regions on an active surface of the semiconductor substrate, a dicing regions provided between adjacent integrated circuit regions of the plurality of integrated circuit regions, and a metal shield layer provided on the active surface across at least a portion of the adjacent integrated circuit regions and the dicing region, forming a modified layer by irradiating laser to an inside of the semiconductor substrate along the dicing region, propagating a crack from the modified layer in a direction perpendicular to a major-axial direction of the metal shield layer by polishing an inactive surface opposing the active surface of the semiconductor substrate and forming semiconductor chips by separating the adjacent integrated circuit regions, respectively, based on the crack propagating from the modified layer.

16 Claims, 20 Drawing Sheets

(51) Int. Cl.
*H01L 23/00* (2006.01)
*H01L 23/58* (2006.01)

(56) References Cited

U.S. PATENT DOCUMENTS

| | | | |
|---|---|---|---|
| 8,299,580 B2 | 10/2012 | Kumakawa et al. | |
| 8,492,676 B2 | 7/2013 | Azuma et al. | |
| 9,041,162 B2 | 5/2015 | Miccoli et al. | |
| 9,406,625 B2 | 8/2016 | Wang et al. | |
| 9,640,420 B2 | 5/2017 | Nakamura | |
| 10,297,710 B2 | 5/2019 | Kirihara | |
| 10,418,335 B2 | 9/2019 | Cho et al. | |
| 2002/0024115 A1* | 2/2002 | Ibnabdeljalil | H01L 23/562 257/E23.194 |
| 2003/0122220 A1* | 7/2003 | West | H01L 23/562 257/E23.194 |
| 2005/0272223 A1* | 12/2005 | Fujii | H01L 21/304 438/459 |
| 2006/0022224 A1* | 2/2006 | Hiroi | H01L 23/522 257/E21.582 |
| 2006/0163699 A1* | 7/2006 | Kumakawa | H01L 23/544 257/E23.179 |
| 2007/0066044 A1 | 3/2007 | Abe et al. | |
| 2007/0111477 A1 | 5/2007 | Maruyama et al. | |
| 2008/0067690 A1* | 3/2008 | Kumagai | H01L 23/585 257/774 |
| 2008/0203538 A1 | 8/2008 | Kumakawa et al. | |
| 2009/0014882 A1* | 1/2009 | Ito | H01L 23/562 257/E23.141 |
| 2009/0121313 A1* | 5/2009 | Hashimoto | H01L 23/585 438/667 |
| 2009/0121321 A1* | 5/2009 | Miccoli | G03F 9/7084 257/E23.179 |
| 2009/0121337 A1* | 5/2009 | Abe | H01L 23/544 257/E21.237 |
| 2009/0201043 A1* | 8/2009 | Kaltalioglu | H01L 23/585 324/762.05 |
| 2009/0321890 A1* | 12/2009 | Jeng | H01L 23/562 257/E23.193 |
| 2010/0123219 A1* | 5/2010 | Chen | B23K 26/40 257/E23.08 |
| 2010/0133659 A1* | 6/2010 | Hara | H01L 23/544 257/E23.179 |
| 2010/0283128 A1* | 11/2010 | Chen | H01L 21/32051 257/E23.179 |
| 2010/0314619 A1* | 12/2010 | Kaltalioglu | H01L 22/34 257/E21.585 |
| 2011/0241164 A1* | 10/2011 | Nakamura | H01L 23/585 257/774 |
| 2012/0038028 A1* | 2/2012 | Yaung | H01L 21/78 257/E23.18 |
| 2012/0211748 A1* | 8/2012 | Miccoli | H01L 21/78 257/618 |
| 2013/0075869 A1* | 3/2013 | Mackh | H01L 21/78 257/E23.179 |
| 2014/0264767 A1* | 9/2014 | Gratz | H01L 23/585 257/620 |
| 2016/0005697 A1* | 1/2016 | Noh | H01L 23/562 257/508 |
| 2016/0013138 A1* | 1/2016 | Chen | H01L 23/585 257/774 |
| 2016/0163916 A1* | 6/2016 | Ilievski | H01L 33/007 438/33 |
| 2016/0380605 A1 | 12/2016 | Matsumoto et al. | |
| 2017/0047221 A1* | 2/2017 | Harada | H01L 21/67092 |
| 2017/0207181 A1* | 7/2017 | Nakamura | H01L 21/6836 |
| 2018/0175006 A1* | 6/2018 | Yan | H01L 23/585 |
| 2018/0261555 A1* | 9/2018 | Cho | H01L 21/02675 |
| 2019/0157150 A1* | 5/2019 | Park | H01L 21/76811 |
| 2020/0058551 A1* | 2/2020 | Bae | H01L 21/6836 |
| 2021/0098392 A1* | 4/2021 | Wu | H01L 27/14634 |

FOREIGN PATENT DOCUMENTS

| | | |
|---|---|---|
| JP | 2005-340423 A | 12/2005 |
| JP | 2011-166183 A | 8/2011 |
| JP | 2016-54204 A | 4/2016 |
| JP | 2016-207765 A | 12/2016 |
| KR | 10-2006-0020627 A | 3/2006 |
| KR | 10-2006-0085165 A | 7/2006 |
| KR | 10-2010-0036241 A | 4/2010 |
| KR | 10-2017-0053112 A | 5/2017 |
| KR | 10-2018-0104261 A | 9/2018 |

OTHER PUBLICATIONS

Communication issued on Jul. 7, 2025 by the China National Intellectual Property Administration in Chinese Patent Application No. 202010673029.1.

* cited by examiner

SEMICONDUCTOR SUBSTRATE AND METHOD OF DICING THE SAME

CROSS-REFERENCE TO RELATED APPLICATION

This application is based on and claims priority from Korean Patent Application No. 10-2019-0100527, filed on Aug. 16, 2019, in the Korean Intellectual Property Office, the disclosure of which is incorporated herein in its entirety by reference.

BACKGROUND

The disclosure relates to a semiconductor substrate and a method of dicing the same, and more particularly, to a method of cutting a semiconductor substrate by using laser.

In a chip manufacturing process, after integrated circuits are formed on an active surface of a semiconductor substrate, an inactive surface of the semiconductor substrate is polished and the polished semiconductor substrate is diced to separate the integrated circuits into respective semiconductor chips. Generally, the polished semiconductor substrate is mechanically diced using a sawing blade. When mechanical dicing is performed in this way, a diced surface of the semiconductor chips may break, causing many faults in the semiconductor chips. Hence, a method of dicing a semiconductor substrate using laser has been studied.

SUMMARY

The disclosure provides a semiconductor substrate that suppresses faults generation and a method of dicing the semiconductor substrate, in a process of dicing the semiconductor substrate into semiconductor chips by using laser.

Aspects of the disclosure are not limited to the foregoing, and other unmentioned aspects would be apparent to one of ordinary skill in the art from the following description.

According to an aspect of the disclosure, there is provided a method of dicing a semiconductor wafer, the method comprising: providing a semiconductor substrate having a plurality of integrated circuit regions on an active surface of the semiconductor substrate, a dicing regions provided between adjacent integrated circuit regions of the plurality of integrated circuit regions, and a metal shield layer provided on the active surface across at least a portion of the adjacent integrated circuit regions and the dicing region; forming a modified layer by irradiating laser to an inside of the semiconductor substrate along the dicing region; propagating a crack from the modified layer in a direction perpendicular to a major-axial direction of the metal shield layer by polishing an inactive surface opposing the active surface of the semiconductor substrate; and forming semiconductor chips by separating the adjacent integrated circuit regions, respectively, based on the crack propagating from the modified layer.

According to another aspect of the disclosure, there is provided a method of dicing a semiconductor wafer, the method comprising: providing a semiconductor substrate having a plurality of integrated circuit regions on an active surface of the semiconductor substrate, a dicing regions provided between adjacent integrated circuit regions of the plurality of integrated circuit regions, and a metal shield layer formed on the active surface across at least a portion of the integrated circuit regions and the dicing region; forming a modified layer by irradiating laser to an inside of the semiconductor substrate along the dicing region; propagating a crack from the modified layer in a direction perpendicular to a major-axial direction of the metal shield layer by polishing an inactive surface opposing the active surface of the semiconductor substrate; and forming semiconductor chips by separating the adjacent integrated circuit regions, respectively, based on the crack propagating from the modified layer, wherein, in a cross-sectional view, the metal shield layer includes a first metal shield layer and a second metal shield layer with a space region therebetween in a location where the crack propagates, each of the first metal shield layer and the second metal shield layer includes a major axis that is parallel to the active surface and a minor axis that is perpendicular to the active surface in the cross-sectional view, and a length of the major axis is about 50 µm to about 100 µm, and a length of the minor axis is about 0.5 µm to about 1 µm.

According to an aspect of the disclosure, there is provided a semiconductor wafer comprising: a semiconductor substrate comprising a plurality of integrated circuit regions on an active surface; a dicing regions provided between adjacent integrated circuit regions of the plurality of integrated circuit regions; and a metal shield layer provided on the active surface across a portion of the adjacent integrated circuit regions and the dicing region, wherein, in a cross-sectional view, the metal shield layer comprises a major axis that is parallel to the active surface and a minor axis that is perpendicular to the active surface, and in a planar view, the metal shield layer is arranged along a circumference of a respective integrated circuit region, among the adjacent integrated circuit regions.

According to an aspect of the disclosure, there is provided a semiconductor device comprising: a semiconductor substrate comprising an integrated circuit region and a dicing region on an active surface of the semiconductor substrate, the dicing region being provided adjacent to the integrated circuit region; a metal shield layer provided on the active surface across the integrated circuit region and the dicing region; a device layer comprising one or more semiconductor devices provided on the active surface of the semiconductor substrate; one or more wires provided in a wiring layer formed on the device layer; and one or more vertical metal structures formed on the metal shield layer, wherein, in a cross-sectional view, the metal shield layer comprises a major axis that is parallel to the active surface and a minor axis that is perpendicular to the active surface, and wherein, in the cross-sectional view, the one or more vertical metal structures are perpendicular to the major axis of the metal shield layer.

BRIEF DESCRIPTION OF THE DRAWINGS

Embodiments of the disclosure will be more clearly understood from the following detailed description taken in conjunction with the accompanying drawings in which:

FIGS. 12A and 12B illustrate a semiconductor substrate according to another embodiment of the disclosure, in which FIG. 12A is an enlarged side cross-sectional view of a region A illustrated in FIG. 1 and FIG. 12B is an enlarged plane view of a region C illustrated in FIG. 1;

FIG. 13 illustrates a semiconductor substrate according to another embodiment of the disclosure, in which FIG. 13 is an enlarged side cross-sectional view of a region A illustrated in FIG. 1;

DETAILED DESCRIPTION OF THE EMBODIMENTS

Hereinafter, embodiments of the disclosure will be described in detail with reference to the accompanying drawings.

Figure 1:
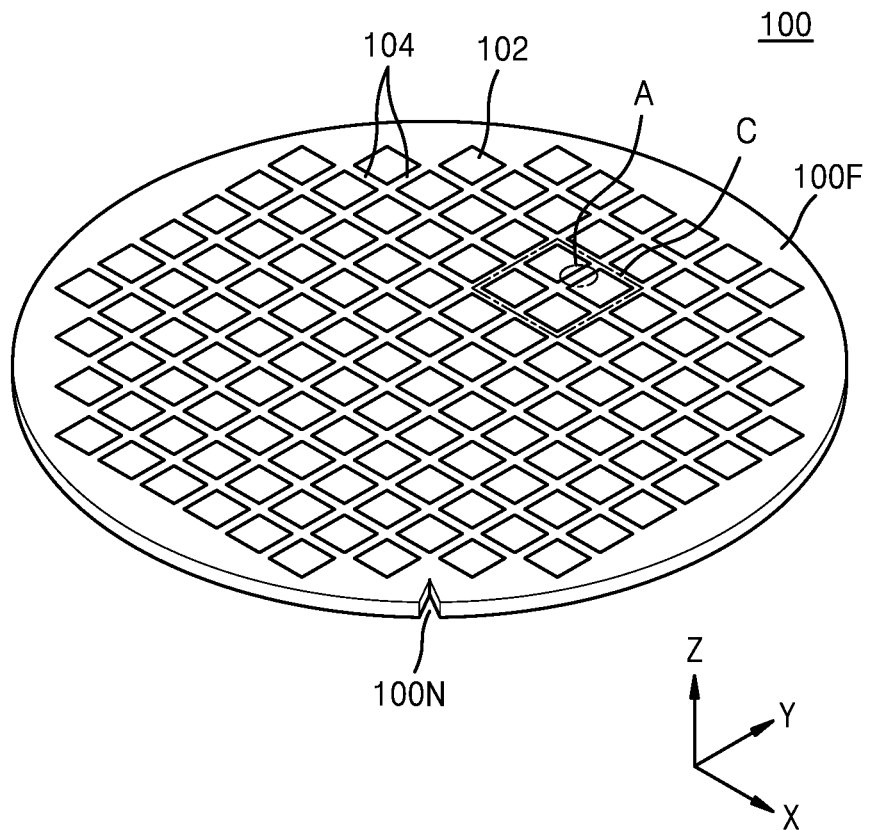
FIG. 1 is a perspective view of a semiconductor substrate according to an exemplary embodiment of the disclosure.
Figure 2A:
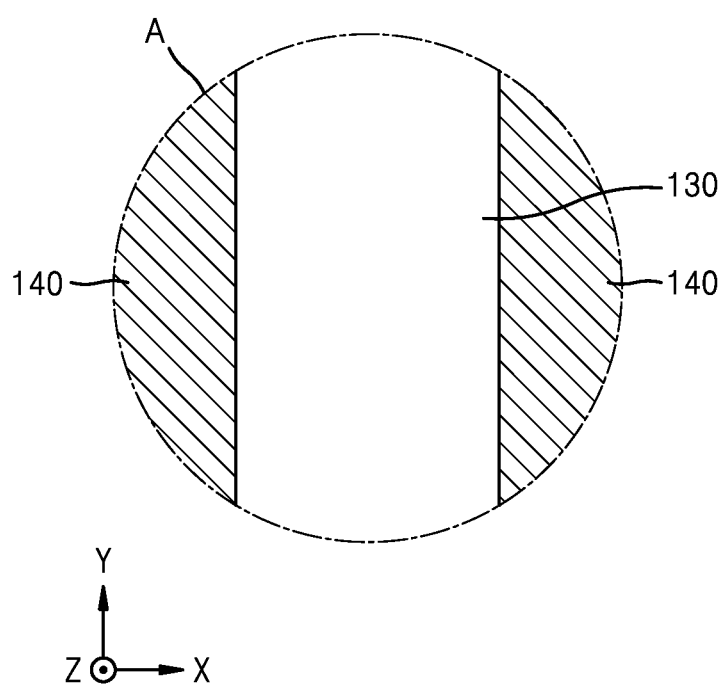
FIG. 2A is an enlarged plane view of a region A illustrated in FIG. 1.
Figure 2B:
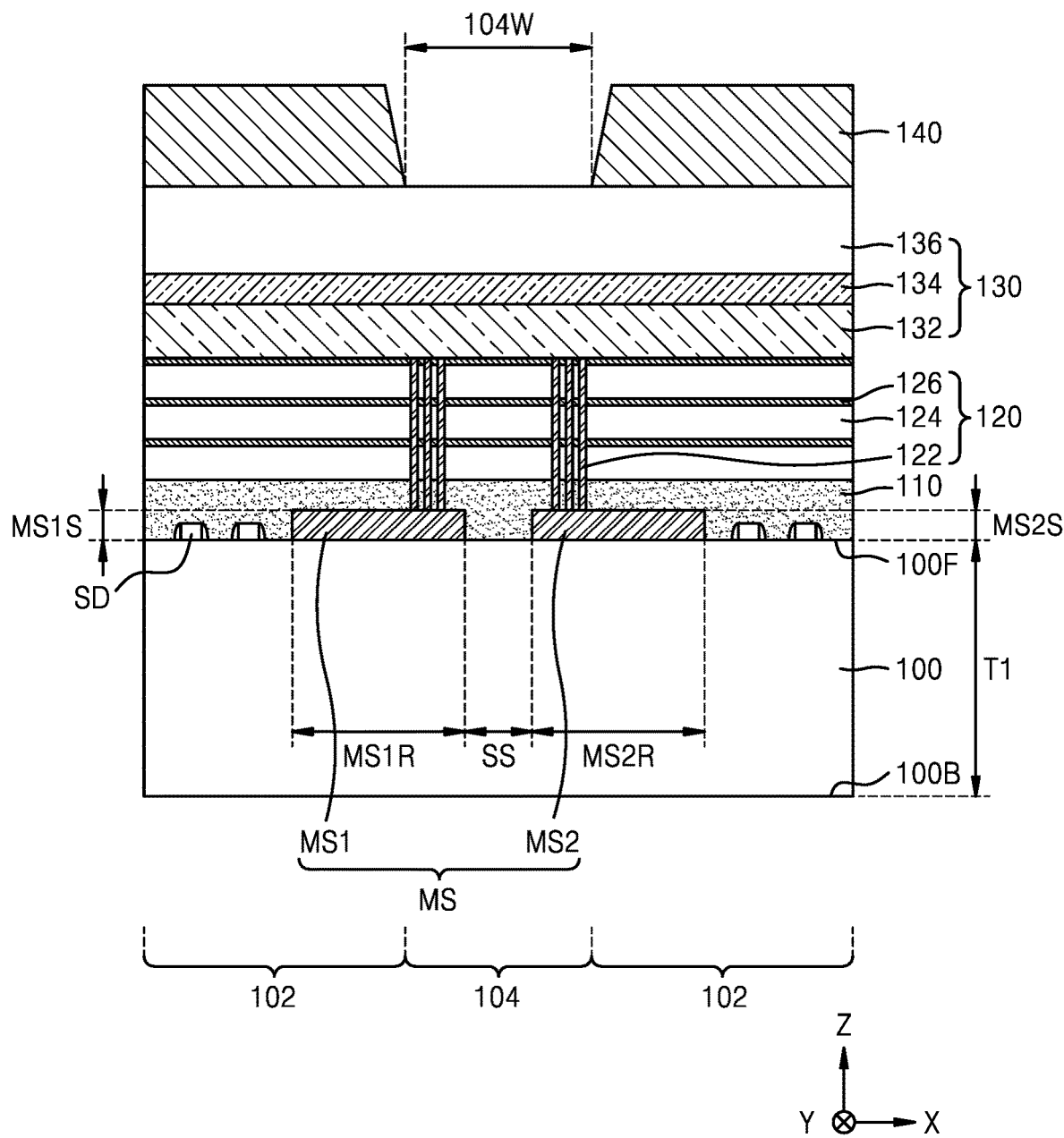
FIG. 2B is a side cross-sectional view corresponding to a surface taken by dicing a center of FIG. 2A in a direction X.
Figure 2C:
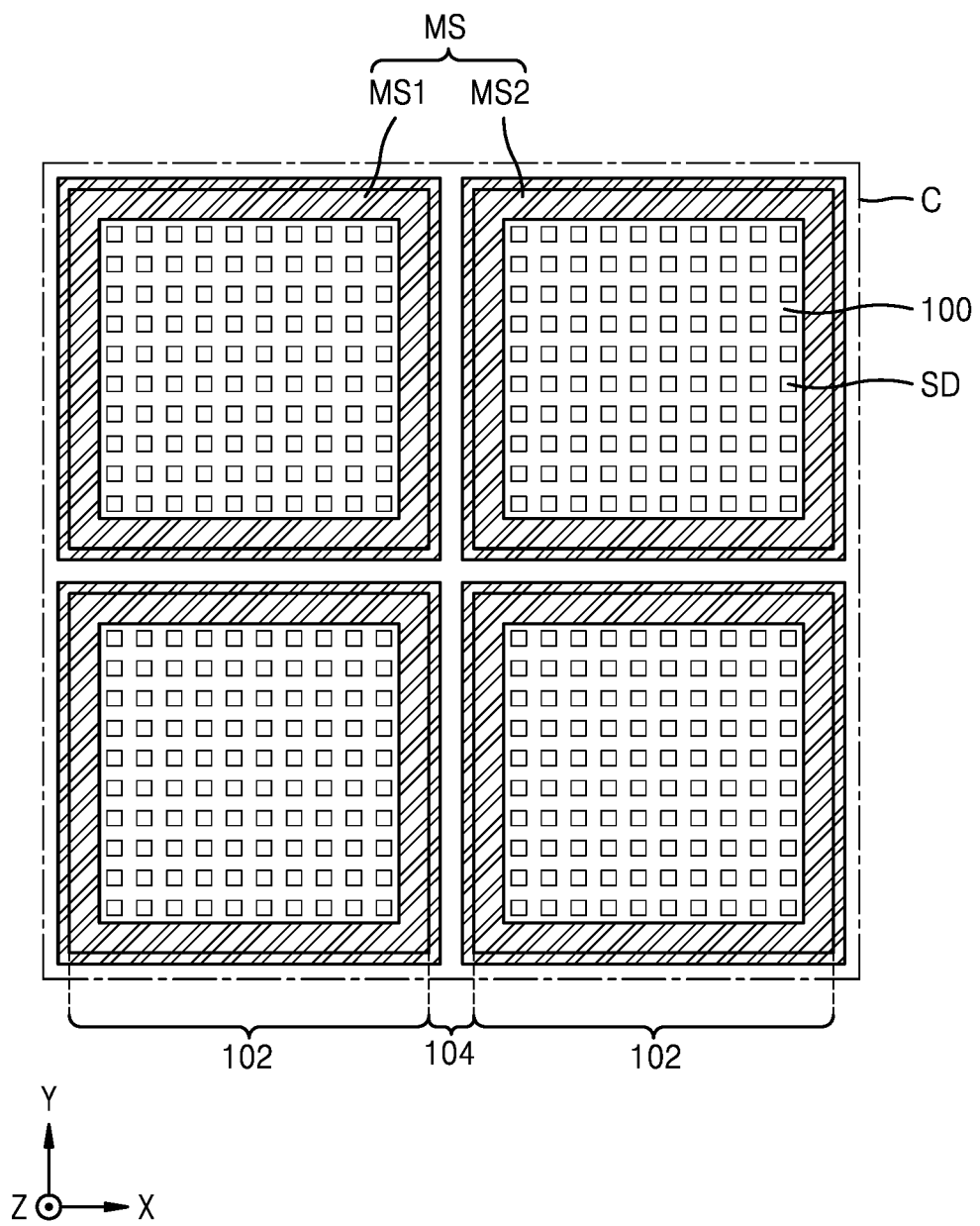
FIG. 2C is an enlarged plane view of a region C illustrated in FIG. 1.

FIG. 1 is a perspective view of a semiconductor substrate according to an exemplary embodiment of the disclosure, FIG. 2A is an enlarged plane view of a region A illustrated in FIG. 1, FIG. 2B is a side cross-sectional view corresponding to a surface taken by dicing a center of FIG. 2A in a direction X, and FIG. 2C is an enlarged plane view of a region C illustrated in FIG. 1.

Referring to FIG. 1, FIGS. 2A, 2B and 2C, a semiconductor substrate 100 includes integrated circuit regions 102 and a dicing region 104.

According to an exemplary embodiment, a semiconductor substrate 100 may include a wafer and may have a circular shape having a constant first thickness T1. The semiconductor substrate 100 may have a notch 100N used as a reference point of wafer alignment.

The semiconductor substrate 100 may include, for example, silicon. Alternatively, the semiconductor substrate 100 may include a semiconductor element like germanium or a compound semiconductor such as silicon carbide (SiC), gallium arsenide (GaAs), indium arsenide (InAs), and indium phosphide (InP). The semiconductor substrate 100 may have a silicon-on-insulator (SOI) structure. In some embodiments of the disclosure, the semiconductor substrate 100 may include a well or structure doped with impurities, which is a conductive region. The semiconductor substrate 100 may have various element isolation structures such as a shallow trench isolation (STI) structure.

Herein, the semiconductor substrate 100 is assumed to have a diameter of about 12 inches, and a description will be made of a case where a silicon wafer is used. However, it will be understood by those of ordinary skill in the art that the semiconductor substrate 100 having a diameter greater or less than the above-described diameter may be used and the semiconductor substrate 100 formed of other materials may also be used. The semiconductor substrate 100 may have a first thickness T1 of about 0.1 mm to about 1 mm. When the first thickness T1 of the semiconductor substrate 100 is too small, mechanical strength may be unsatisfactory; when the first thickness T1 is too large, a time spent in subsequent grinding increases, degrading the productivity of a semiconductor chip.

The semiconductor substrate 100 may include an active surface 100F that is a front side and an inactive surface 100B that is a back side. According to an exemplary embodiment, multiple integrated circuit regions 102 may be formed on the active surface 100F, and the multiple integrated circuit regions 102 are to be separated into semiconductor chips (10 of FIG. 10).

According to an exemplary embodiment, a semiconductor device SD may be formed on the active surface 100F of the semiconductor substrate. According to an exemplary embodiment, the semiconductor substrate may be classified into a memory device and a logic device.

The memory device may include a volatile memory device or a non-volatile memory device. The volatile memory device may include an existing volatile memory device and a currently developed volatile memory device, for example, dynamic random access memory (DRAM), static RAM (SRAM), thyristor RAM (TRAM), zero capacitor RAM (ZRAM), or twin transistor RAM (TTRAM). The non-volatile memory device may include an existing non-volatile memory device and a currently developed non-volatile memory device, for example, flash memory, magnetic RAM (MRAM), spin-transfer torque (STT)-MRAM, ferroelectric RAM (FRAM), phase change RAM (PRAM), resistive RAM (RRAM), nanotube RRAM, polymer RAM, nano floating gate memory, holographic memory, molecular electronics memory, or insulator resistance change memory.

The logic device may be implemented with, but not limited to, a microprocessor, a graphics processor, a signal processor, a network processor, an audio codec, a video codec, an application processor, a system-on-chip, etc. The microprocessor may include, for example, a single core or a multi-core.

The integrated circuit regions 102 may be arranged to be isolated from one another by the dicing region 104. The dicing region 104 may be referred to as a scribe lane. The dicing region 104 may extend in a form of a cross in a first direction X and a second direction Y that is perpendicular to the first direction X. The dicing region 104 may have a form of a linear lane having a constant width 104W.

That is, the integrated circuit regions 102 may be arranged to be separated from one another by being surrounded by the dicing region 104 in all directions. As will be described below, as the semiconductor substrate 100 and various types of material layers formed on the semiconductor substrate 100 are diced through a dicing process performed along the dicing region 104, the integrated circuit regions 102 may be separated into a plurality of semiconductor chips (10 of FIG. 10) from one another.

A semiconductor device layer 110 may be formed on the active surface 100F of the semiconductor substrate 100. The semiconductor device layer 110 may correspond to a plurality of semiconductor devices (SDs) in the integrated circuit regions 102 and may correspond to a region including a plurality of semiconductor dummy devices in the dicing region 104.

Multi-layer wires 120 may be formed from a top surface of the semiconductor device layer 110 to a bottom surface of an upper material film 130. The multi-layer wires 120 may include an inter-layer insulating film 124 and a metal wire 126 that are arranged alternately. The multi-layer wires 120 may include a plurality of metal vertical structures 122 arranged in a third direction Z that is perpendicular to the active surface 100F of the semiconductor substrate 100.

The metal wire 126 may include a conductive material including at least one of aluminum (Al), copper (Cu), nickel (Ni), tungsten (W), platinum (Pt), and gold (Au), and the plurality of metal vertical structures 122 may include a material that is substantially the same as the metal wire 126.

The inter-layer insulating film 124 may include a low dielectric material. The low dielectric material, which has a lower dielectric constant than that of a silicon oxide, may be useful for high integration and high speed of the semiconductor device SD when the low dielectric material is used as the inter-layer insulating film 124 in the semiconductor device SD.

In some exemplary embodiments of the disclosure, the inter-layer insulating film 124 may be formed to have a structure in which a first inter-layer insulating film, a second inter-layer insulating film, and a third inter-layer insulating film are sequentially stacked on the metal wire 126. However, the number of films of the inter-layer insulating film 124 is not limited to the above-described example. The inter-layer insulating film 124 may be formed to fill peripheries of the plurality of metal vertical structures 122 and the metal wire 126 that are formed of a conductive material.

According to an exemplary embodiment, opposite side walls of each of the plurality of metal vertical structures 122 may be formed flat. Each of the plurality of metal vertical structures 122 may be formed of single metal, may have flat side walls, and may have a bar shape with a major axis in the third direction Z and a minor axis in the first direction X. Thus, the plurality of metal vertical structures 122 do not include a bonding interface and a crack producing portion between heterogeneous materials, thereby properly blocking the propagation of a crack described below (CR of FIG. 9B) in the first direction X and the second direction Y and thus effectively inducing the propagation of the crack (CR of FIG. 9B) in the third direction Z.

In the dicing region 104, the multi-layer wires 120 may be formed as a multi-layer dummy wire structure corresponding to metal wires formed in the integrated circuit regions 102.

Although the multi-layer wires 120 are shown as three layers, they are not limited thereto. For example, the multi-layer wires 120 may be formed as two layers or four or more layers.

The upper material film 130 may be formed on the multi-layer wires 120. That is, a level of the lowermost surface of the upper material film 130 may be the same as or higher than a level of the uppermost surface of the multi-layer wires 120.

The upper material film 130 may be formed in a form where a first material film 132, a second material film 134, and a third material film 136 are sequentially stacked. Each of the first material film 132, second material film 134, and third material film 136 may include an insulating film and may be formed of different materials. In some exemplary embodiments of the disclosure, the first material film 132 may include a silicon oxide, the second material film 134 may include a silicon carbonitride (SiCN), and the third material film 136 may include a silicon nitride. Although the upper material film 130 is shown as three films, it is not limited thereto. For example, unlike shown, the upper material film 130 may be formed as two films or four or more films.

In other exemplary embodiments of the disclosure, the upper material film 130 may be formed to have a structure where a silicon oxide, such as phosphor silicate glass (PSG), boro-phosphor silicate glass (BPSG), undoped silicate glass (USG), tetra ethyl ortho silicate (TEOS), plasma enhanced-TEOS (PE-TEOS), or high density plasma-chemical vapor deposition (HDP-CVD) oxide, and a silicon nitride are stacked alternately.

According to another exemplary embodiment, the upper material film 130 of the dicing region 104 may include a test pattern for testing electrical characteristics of the semiconductor device SD existing in the integrated circuit regions 102, a redistribution layer for electrical connection between the test patterns, or an alignment key for aligning a mask.

According to an exemplary embodiment of the disclosure, a protective film 140 may be formed to expose the upper material film 130 located in the dicing region 104W and to cover the upper material film 130 located in the integrated circuit regions 102. A side wall of the protective film 140 may be an inclined plane. The protective film 140 may include a material film formed of, for example, an organic compound. In some exemplary embodiments of the disclosure, the protective film 140 may include a material film formed of an organic high-polymer material. In other exemplary embodiments of the disclosure, the protective film 140 may include photosensitive polyimide (PSPI) resin. A width 104W of the dicing region 104 exposed from the protective film 140 may be about 5 μm to about 100 μm. However, a numerical value of the width 104W is not limited to the above example.

The metal shield layer MS may be formed on the active surface 100F of the semiconductor substrate 100 across the integrated circuit regions 102 and the dicing region 104. The metal shield layer MS may prevent a spot generated due to leakage or scattering of laser in a dicing process from spreading to the integrated circuit regions 102.

A bottom surface of the metal shield layer MS may be arranged to directly contact the active surface 100F. In other words, the metal shield layer MS may be formed in a middle-end-of-line (MEOL) process. Thus, in the integrated circuit regions 102 of the semiconductor substrate 100, the semiconductor device SD may not be arranged in a location where the metal shield layer MS is formed.

In a side cross-section view, the metal shield layer MS may include a first metal shield layer MS1 and a second metal shield layer MS2 with a space region SS of a first interval therebetween in the dicing region 104. In terms of locations, the first metal shield layer MS1 may be referred to as a left metal shield layer and the second metal shield layer MS2 may be referred to as a right metal shield layer. The first interval of the space region SS may be narrower than the width 104W of the dicing region 104.

The first metal shield layer MS1 may have a major axis MS1R in the first direction X that is parallel to the active surface 100F and a minor axis MS in the third direction Z that is perpendicular to the active surface 100F. The second metal shield layer MS2 may have a major axis MS2R in the first direction X that is parallel to the active surface 100F and a minor axis MS2S in the third direction Z that is perpendicular to the active surface 100F.

Lengths of the major axes MS1R and MS2R may be about 50 µm to about 100 µm, and lengths of the minor axes MS1S and MS2S may be about 0.5 µm to about 1 µm. Describing the above examples as ratios, a ratio of the lengths of the major axes MS1R and MS2R to the lengths of the minor axes MS and MS2S may be about 50:1 to about 200:1.

That is, each of the first metal shield layer MS1 and the second metal shield layer MS2 may be formed as a thin flat plate-type structure to cover the semiconductor substrate 100. The first metal shield layer MS1 and the second metal shield layer MS2 may substantially have the same shape as each other, but the disclosure is not limited thereto.

In a side cross-section view, a propagation direction of a crack (CR of FIG. 9B) and a major-axial direction of the metal shield layer MS may be perpendicular to each other. That is, the propagation direction of the crack (CR of FIG. 9B) may be the third direction Z, and the major-axial direction of the metal shield layer MS may be the first direction X.

In a plane view, the metal shield layer MS may include single metal in a hollow rectangular or square shape in each of adjacent integrated circuit regions 102 with the dicing region 104 therebetween. To allow the crack (CR of FIG. 9B) to pass through the space region SS, the metal shield layers MS may be arranged to be spaced apart from each other by a distance. In other words, the metal shield layer MS may be arranged to surround a semiconductor chip (10 of FIG. 10).

A material of the metal shield layer MS may be metal having a melting point of about 600° C. or higher. To prevent the metal shield layer MS from being melted, the metal shield layer MS may include metal having a melting point higher than a temperature of a portion of the semiconductor substrate 100 heated by laser. In some exemplary embodiments of the disclosure, the metal shield layer MS may include aluminum (a melting point of about 660° C.).

Recently, as large volume and high integration of a semiconductor device are required, an area occupied by a dicing region in a semiconductor substrate is reduced. Generally, the semiconductor substrate is mechanically diced using a sawing blade. As such, when mechanical dicing is performed, the risk of damage to integrated circuit regions may increase due to stress applied to the semiconductor substrate during a dicing process.

Hence, a process of dicing a semiconductor substrate by using laser has been performed. However, due to a difference between a density of a modified layer of the semiconductor substrate and a density of a periphery of the modified layer, a part of laser that has to be focused onto an inside of the semiconductor substrate leaks or is scattered, and penetrates a semiconductor device of an integrated circuit region, causing a fault.

Thus, the semiconductor substrate 100 according to the disclosure may prevent the leaking or scattering laser from entering regions where the semiconductor device SD are located by forming the metal shield layer MS across the integrated circuit regions 102 and the dicing region 104 of the semiconductor substrate 100. In this way, it is possible to prevent a fault such as a function failure occurring in the semiconductor device SD due to leaking or scattering of laser.

As such, a semiconductor chip diced from the semiconductor substrate 100 according to the disclosure has less faults in a dicing process, thereby improving electrical characteristics and production efficiency of the semiconductor chip.

Hereinbelow, a method of dicing the semiconductor substrate 100 including the metal shield layer MS will be described in detail.

Figure 3:
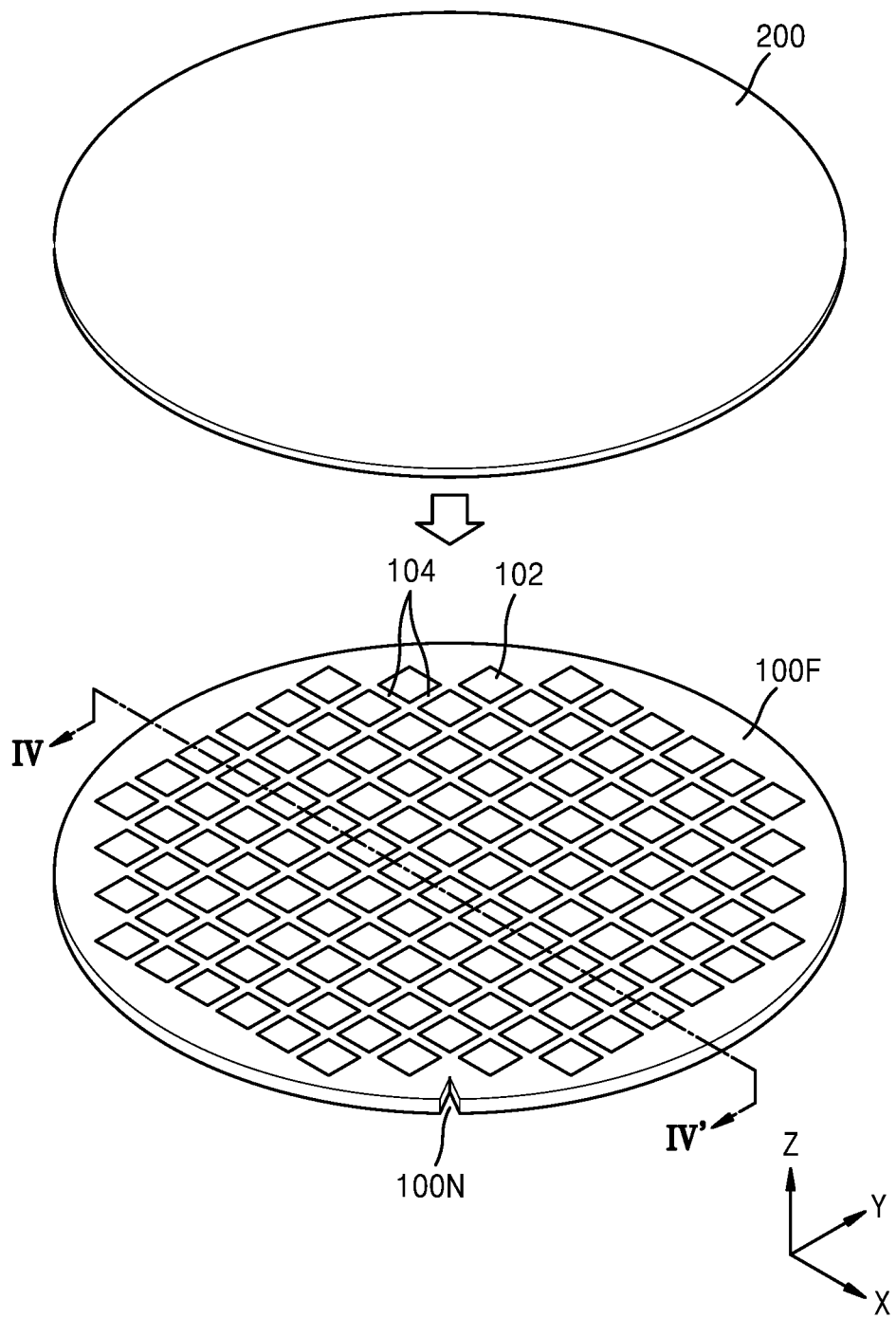
FIG. 3 is a perspective view showing a state in which a protective sheet is attached to a semiconductor substrate, according to an embodiment of the disclosure.
Figure 4:
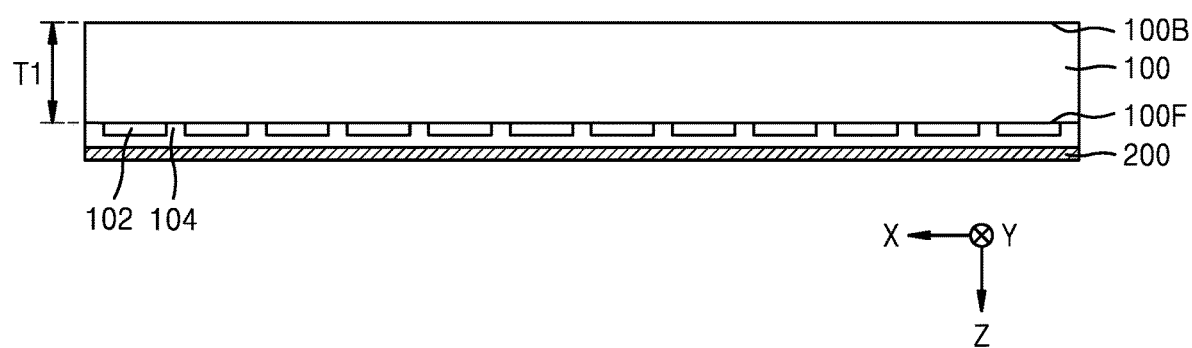
FIG. 4 is a side cross-sectional view corresponding to a line IV-IV' illustrated in FIG. 3, where attachment of a protective sheet to a semiconductor substrate is completed.

FIG. 3 is a perspective view showing a state in which a protective sheet is attached to a semiconductor substrate, according to an exemplary embodiment of the disclosure, and FIG. 4 is a side cross-sectional view corresponding to a line IV-IV' illustrated in FIG. 3, where attachment of a protective sheet to a semiconductor substrate is completed.

Referring to FIGS. 3 and 4, a protective sheet 200 may be attached onto the active surface 100F of the semiconductor substrate 100.

The protective sheet 200 may protect the integrated circuit regions 102 during a dicing process of the semiconductor substrate 100.

The protective sheet 200 may include a polymer sheet based on polyvinylchloride (PVC) and may be attached onto the active surface 100F using an acrylic resin-based adhesive. The acrylic resin-based adhesive may have a thickness of about 2 µm to about 10 µm, and the protective sheet 200 may have a thickness of about 60 µm to about 200 µm. The protective sheet 200 may have a circular shape having substantially the same diameter as a diameter of the semiconductor substrate 100.

Figure 5A:
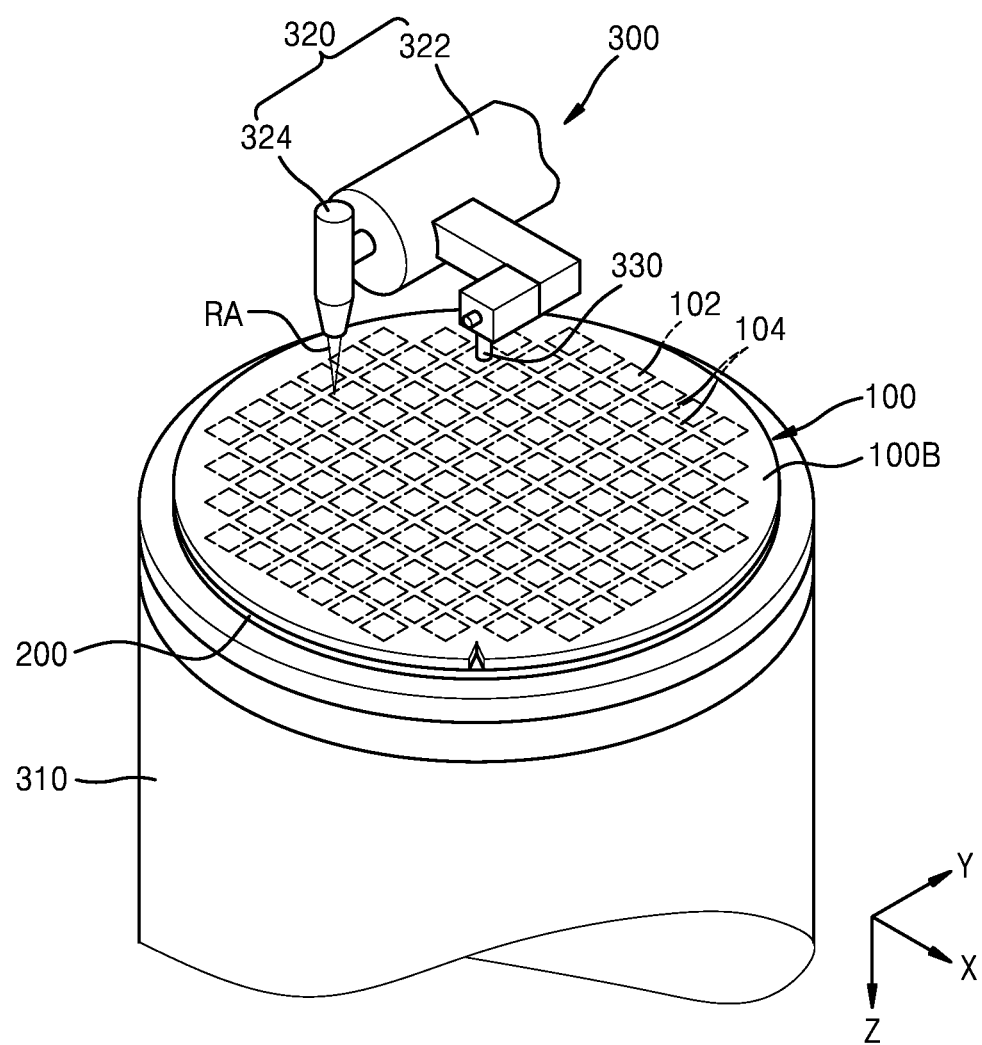
FIG. 5A is a perspective view showing a state where laser is irradiated into a semiconductor substrate according to an embodiment of the disclosure.
Figure 5B:
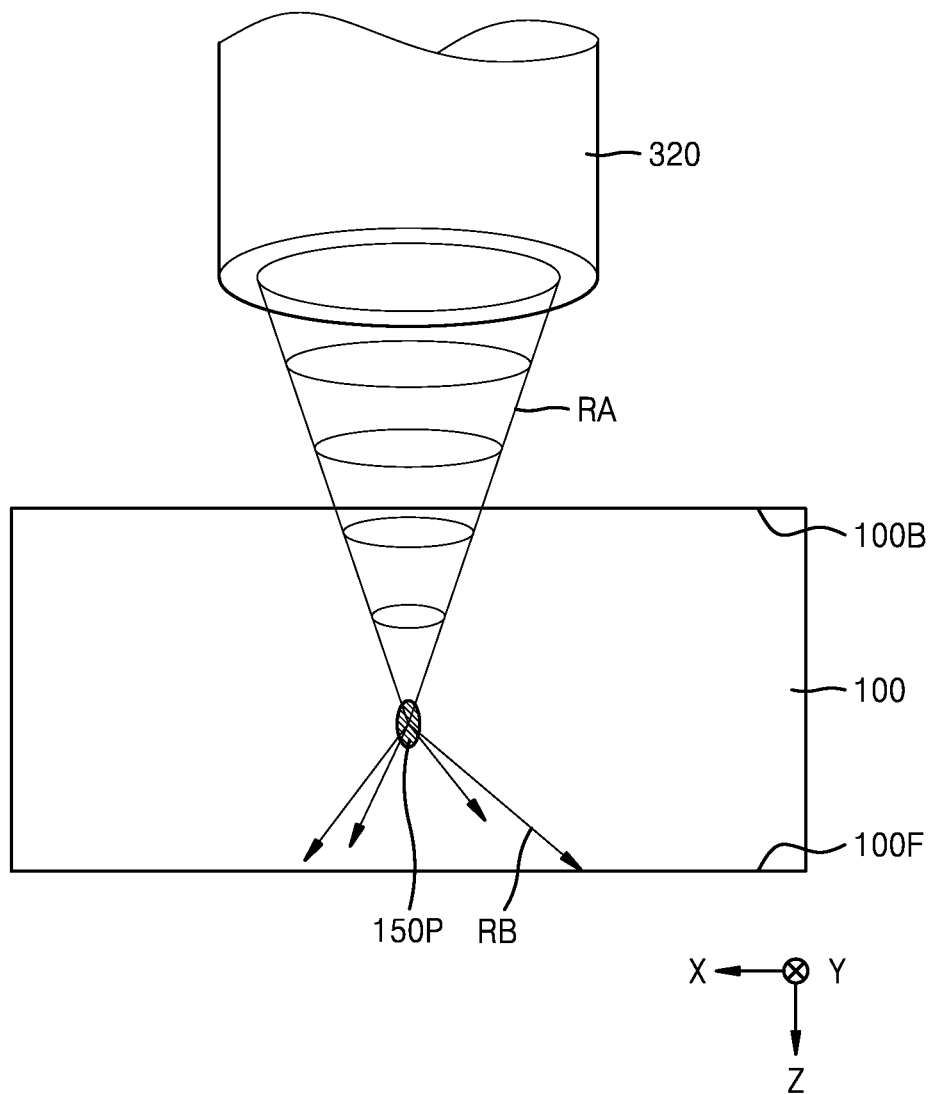
FIG. 5B is a side cross-sectional view showing a traveling direction of laser.

FIG. 5A is a perspective view showing a state where laser is irradiated into a semiconductor substrate according to an exemplary embodiment of the disclosure, and FIG. 5B is a side cross-sectional view showing a traveling direction of laser.

Referring to FIGS. 5A and 5B, after the protective sheet 200 is attached onto the active surface 100F of the semiconductor substrate 100, laser RA of a wavelength having penetrability with respect to the semiconductor substrate 100 may be controlled to have a converging point 150P inside the semiconductor substrate 100 and thus may be irradiated along the dicing region 104.

When the laser RA is irradiated to an inside of the semiconductor substrate 100, a modified layer (150 of FIG. 6) may be formed along the dicing region 104 inside the semiconductor substrate 100. The modified layer (150 of FIG. 6) may be formed using a laser irradiation apparatus 300.

The laser irradiation apparatus 300 may include a chuck table 310 supporting the semiconductor substrate 100, a laser irradiation device 320 irradiating the laser RA to the semiconductor substrate 100 arranged on the chuck table 310, and an imaging device 330 imaging the semiconductor substrate 100 arranged on the chuck table 310. The chuck table 310 may support the semiconductor substrate 100 through suction using vacuum pressure and may move in the first direction X and the second direction Y.

The laser irradiation device 320 may be configured to irradiate pulse laser from a condenser 324 mounted on a front end of a housing 322 in a cylindrical shape arranged substantially horizontally. While the condenser 324 irradiates pulse laser of a wavelength having penetrability with respect to the semiconductor substrate 100, the chuck table 310 and the condenser 324 may perform relative movement at a proper speed.

The imaging device 330 mounted on another front end of the housing 322 constituting the laser irradiation device 320 may be a general charge-coupled device (CCD) imaging device that performs imaging by using visible rays. In another exemplary embodiment of the disclosure, the imaging device 330 may include an infrared irradiation device that irradiates infrared rays to the semiconductor substrate 100, an optical system that captures the infrared rays irradiated by the infrared irradiation rays, and an infrared CCD imaging device that outputs an electrical signal corresponding to the infrared rays captured by the optical system.

The laser irradiation device 320 may irradiate the laser RA after being aligned in a laser irradiation location. The converging point 150P of the laser RA may be controlled to be located closer to the active surface 100F than to the inactive surface 100B of the semiconductor substrate 100. That is, the modified layer (150 of FIG. 6) may be located closer to the active surface 100F.

The laser RA emitted from the laser irradiation device 320 may be intensively irradiated such that a part of the semiconductor substrate 100 is heated to a temperature of about 600° C. That is, the part of the semiconductor substrate 100 located in the converging point 150P of the laser RA may be melted by the laser RA.

As such, when the part of the semiconductor substrate 100 is melted, a crystalline state of the part changes, causing unintended leakage or scattering RB of the laser RA. The leakage or scattering RB of the laser RA may cause a spot in a part other than the converging point 150P of the semiconductor substrate 100, and the spot may cause a fault of the semiconductor device.

Figure 6:
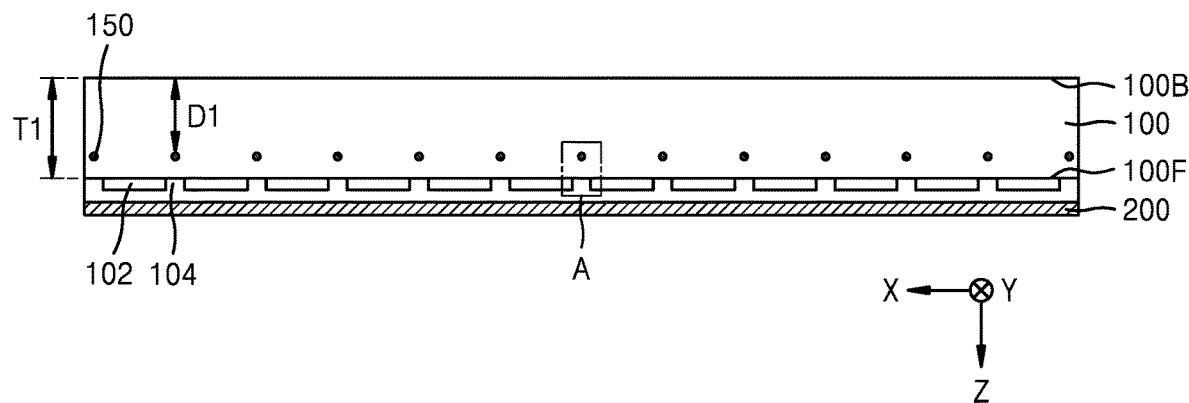
FIG. 6 is a side cross-sectional view showing a state where irradiation of laser is completed, according to an embodiment of the disclosure.
Figure 7A:
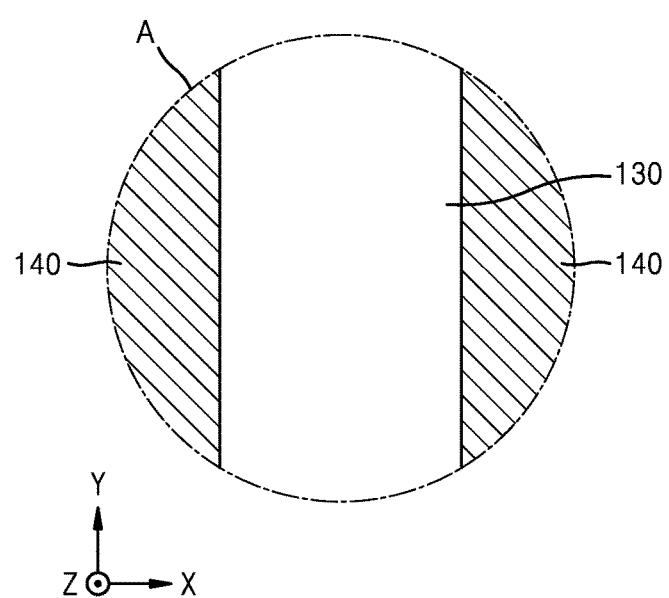
FIG. 7A, which corresponds to FIG. 2A, is an enlarged plane view of a region A illustrated in FIG. 6.
Figure 7B:
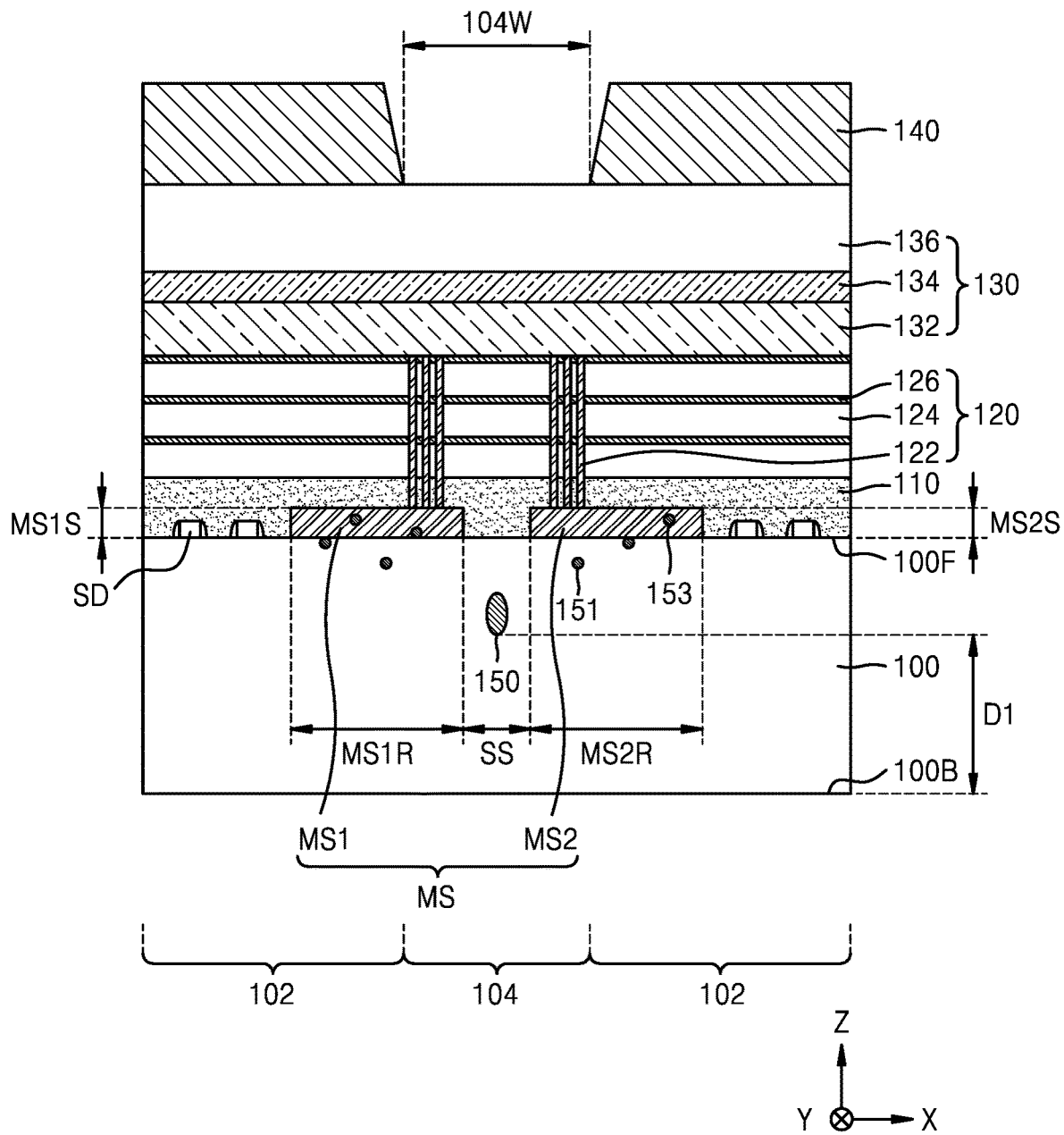
FIG. 7B is a side cross-sectional view corresponding to a surface taken by dicing a center of FIG. 7A in a direction X.

FIG. 6 is a side cross-sectional view showing a state where irradiation of laser is completed, according to an exemplary embodiment of the disclosure, FIG. 7A, which corresponds to FIG. 2A, is an enlarged plane view of a region A illustrated in FIG. 6, and FIG. 7B is a side cross-sectional view corresponding to a surface taken by dicing a center of FIG. 7A in a direction X.

Referring to FIGS. 6, 7A and 7B, the modified layer 150 may be located away from the inactive surface 100B of the semiconductor substrate 100 by a first distance D1, and the modified layer 150 may be located closer to the active surface 100F.

Laser may be easily irradiated to a target location through light amplification by stimulated emission radiation. By using properties of the laser, the modified layer 150 may be formed in a target location inside the semiconductor substrate 100. The modified layer 150 may include a crack site where the crack (CR of FIG. 9B) is initiated by an external physical impact.

A first spot 151 and a second spot 153 may be formed due to unintended leakage or scattering of laser. The first spot 151 may indicate a spot formed inside the semiconductor substrate 100, and the second spot 153 may indicate a spot formed inside the metal shield layer MS. The second spot 153 is formed in a location that may substantially affect the semiconductor device SD, but the semiconductor substrate 100 according to the disclosure may solve such a problem by including the metal shield layer MS.

The modified layer 150 may be located under the semiconductor device layer 110. The modified layer 150 has a constant width in the first direction X, and a virtual line connecting the modified layers 150 in the second direction Y may have a linear lane form.

Figure 8:
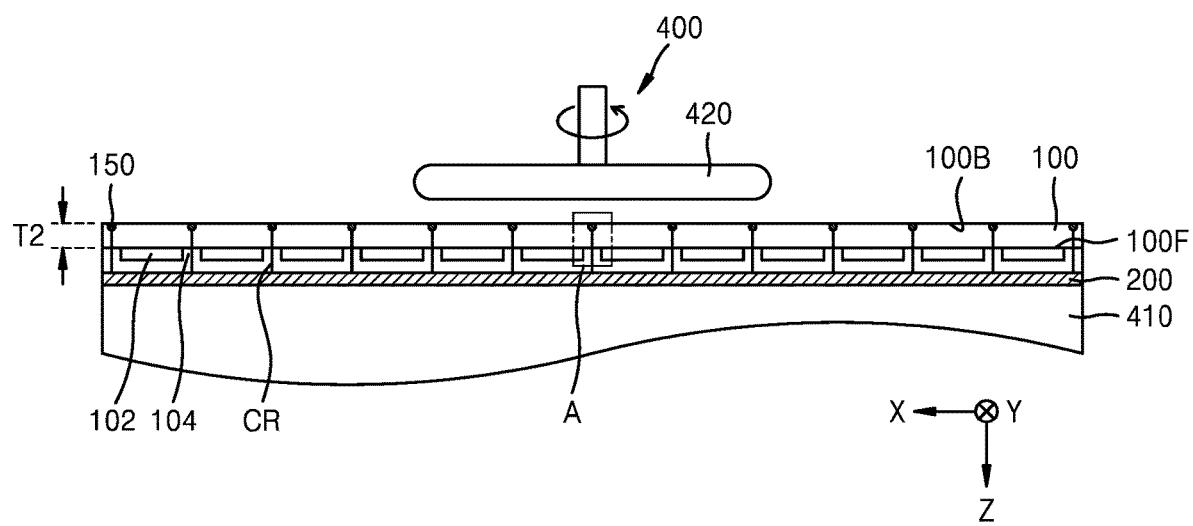
FIG. 8 is a side cross-sectional view showing a state where a semiconductor substrate according to an embodiment of the disclosure is polished.
Figure 9A:
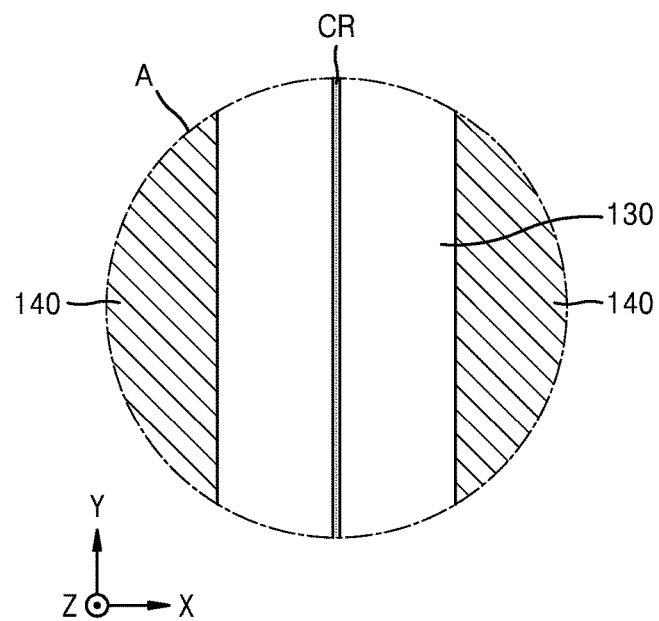
FIG. 9A, which corresponds to FIG. 2A, is an enlarged plane view of a region A illustrated in FIG. 8.
Figure 9B:
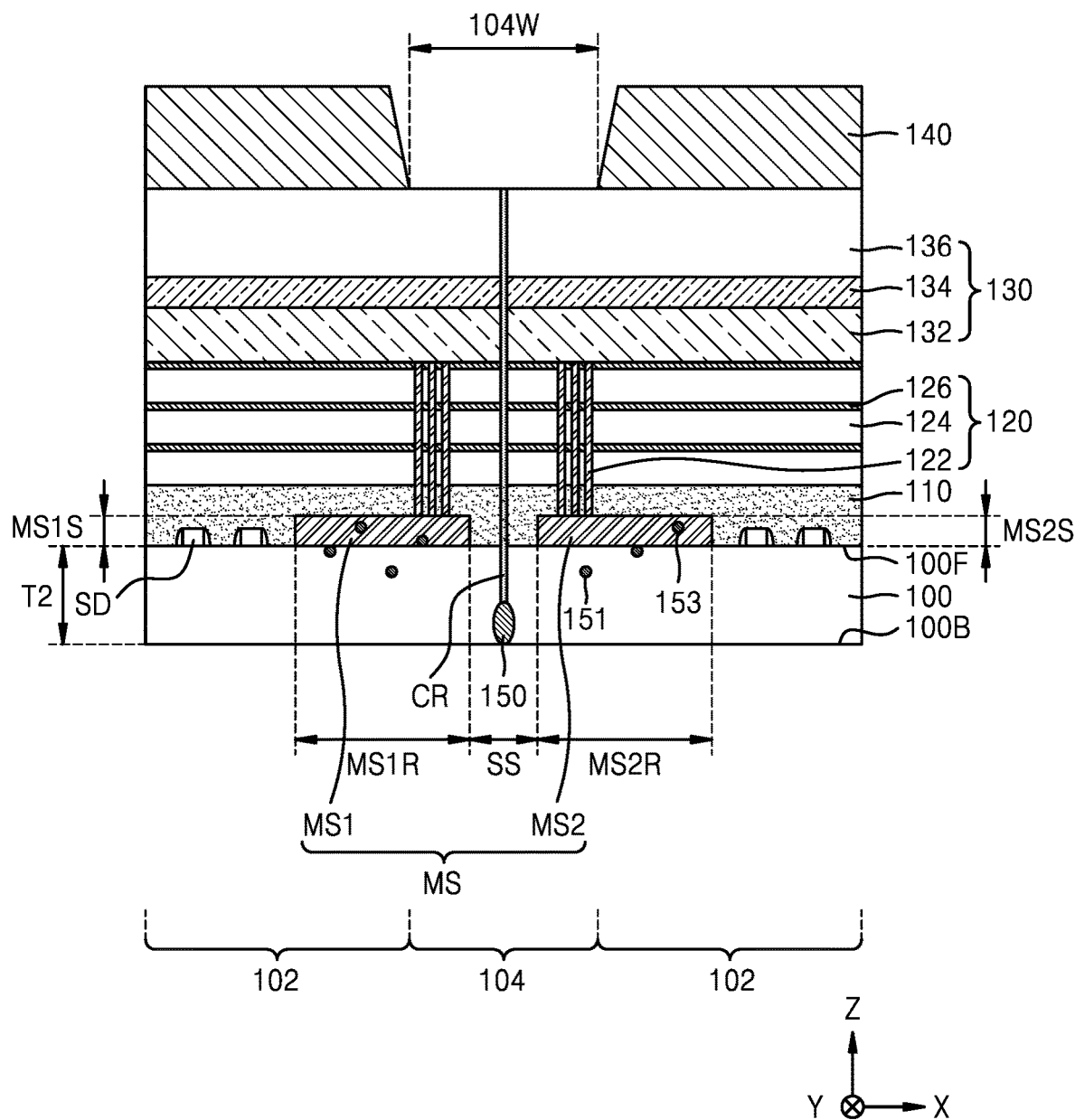
FIG. 9B is a side cross-sectional view corresponding to a surface taken by dicing a center of FIG. 9A in a direction X.

FIG. 8 is a side cross-sectional view showing a state where a semiconductor substrate according to an exemplary embodiment of the disclosure is polished, FIG. 9A, which corresponds to FIG. 2A, is an enlarged plane view of a region A illustrated in FIG. 8, and FIG. 9B is a side cross-sectional view corresponding to a surface taken by dicing a center of FIG. 9A in a direction X.

Referring to FIGS. 8, 9A and 9B, the crack CR may be initiated in the dicing region 104 by polishing the inactive surface 100B of the semiconductor substrate 100.

By polishing the inactive surface 100B of the semiconductor substrate 100 using a polishing device 400, a thickness of the semiconductor substrate 100 may be reduced and the crack CR may propagate from the modified layer 150.

The polishing device 400 may include a chuck table 410 that supports the semiconductor substrate 100 and a grinder 420 that polishes the semiconductor substrate 100 arranged on the chuck table 410. The grinder 420 may move while rotating, and a polishing pad may be attached under the grinder 420.

The semiconductor substrate 100, which is polished, may have a second thickness T2 that is substantially less than the initial first thickness (T1 of FIG. 2B). The second thickness T2 may be about 20 μm to about 50 μm.

By polishing the semiconductor substrate 100 using the polishing device 400, the semiconductor substrate 100, which is polished, having a final thickness may be formed. At the same time, in the dicing region 104, the crack CR may pass through the active surface 100F of the polished semiconductor substrate 100 from the modified layer 150 and propagate in the third direction Z away from the active surface 100F.

According to an exemplary embodiment of the disclosure, laser may be irradiated to the inside of the semiconductor substrate 100 to form the modified layer 150 along the dicing region 104 of the semiconductor substrate 100, and then the inactive surface 100B of the semiconductor substrate 100 may be polished. A polishing process may be a grinding process in a state where physical pressure is applied to the semiconductor substrate 100.

When the polishing process is performed in the state where the physical pressure is applied to the semiconductor substrate 100, the polished semiconductor substrate 100 may be brittle and fractured. The brittle fracture indicates that when a force greater than or equal to an elastic limit is applied to an object, the object is fractured instead of permanently deformed. Thus, during polishing of the inactive surface 100B of the semiconductor substrate 100, the semiconductor substrate 100 that is gradually thinner may be brittle fractured by the crack CR propagating from the modified layer 150. As the crack CR propagating from the modified layer 150 is initiated along the dicing region 104 isolating the integrated circuit regions 102, the integrated circuit regions 102 may be separated into semiconductor chips (10 of FIG. 10) by the brittle fracture of the semiconductor substrate 100. The semiconductor chip (10 of FIG. 10) may be fixed in an original location without leaving the original location, by the protective sheet 200.

In other exemplary embodiments of the disclosure, by continuing polishing the inactive surface 100B of the semiconductor substrate 100, the modified layer 150 may be completely removed. A diced surface of the semiconductor chip (10 of FIG. 10) separated with complete removal of the modified layer 150 may be smoother than a diced surface that is mechanically diced using a sawing blade. Moreover, by completely removing the modified layer 150 in the polishing process, the crack site in the modified layer 150 may be entirely removed, without causing another crack CR.

The crack CR propagating from the modified layer 150 may propagate in the third direction Z. Even when the crack CR partially propagates in the first direction X and/or the second direction Y, the crack CR may not propagate to the integrated circuit regions 102 by being blocked by the plurality of metal vertical structures 122.

Moreover, by using laser, a cut width of the semiconductor substrate 100 may be reduced. Thus, the width of the dicing region 104 may be reduced as compared to mechanical dicing using a sawing blade, forming more integrated circuit regions 102 on the semiconductor substrate 100.

Figure 10:
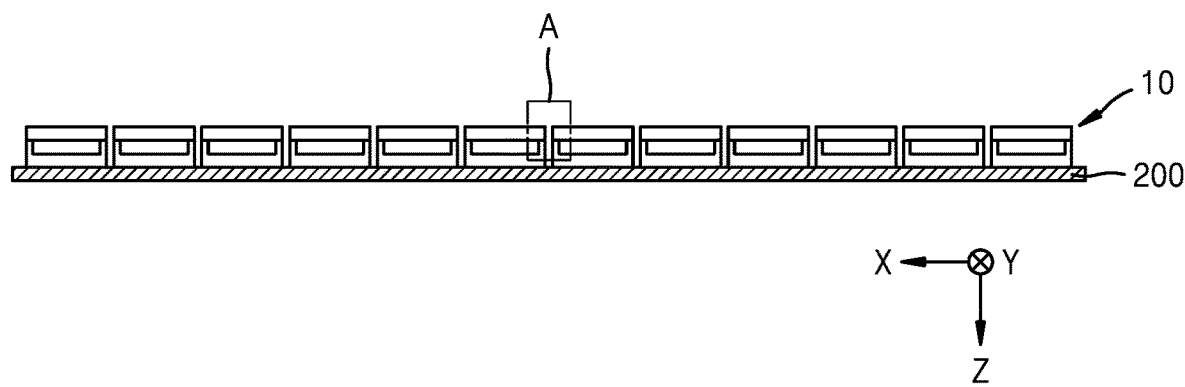
FIG. 10 is a side cross-sectional view showing a state where a semiconductor substrate according to an embodiment of the disclosure is diced into semiconductor chips.
Figure 11A:
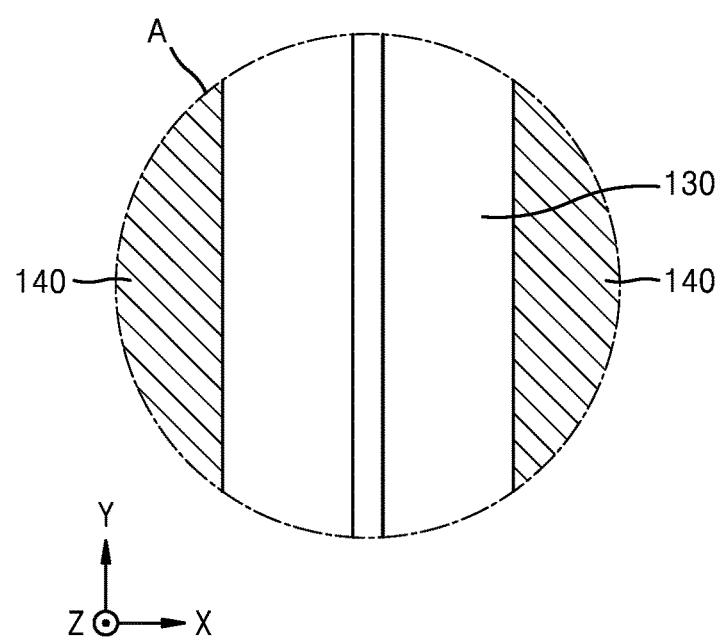
FIG. 11A, which corresponds to FIG. 2A, is an enlarged plane view of a region A illustrated in FIG. 10.
Figure 11B:
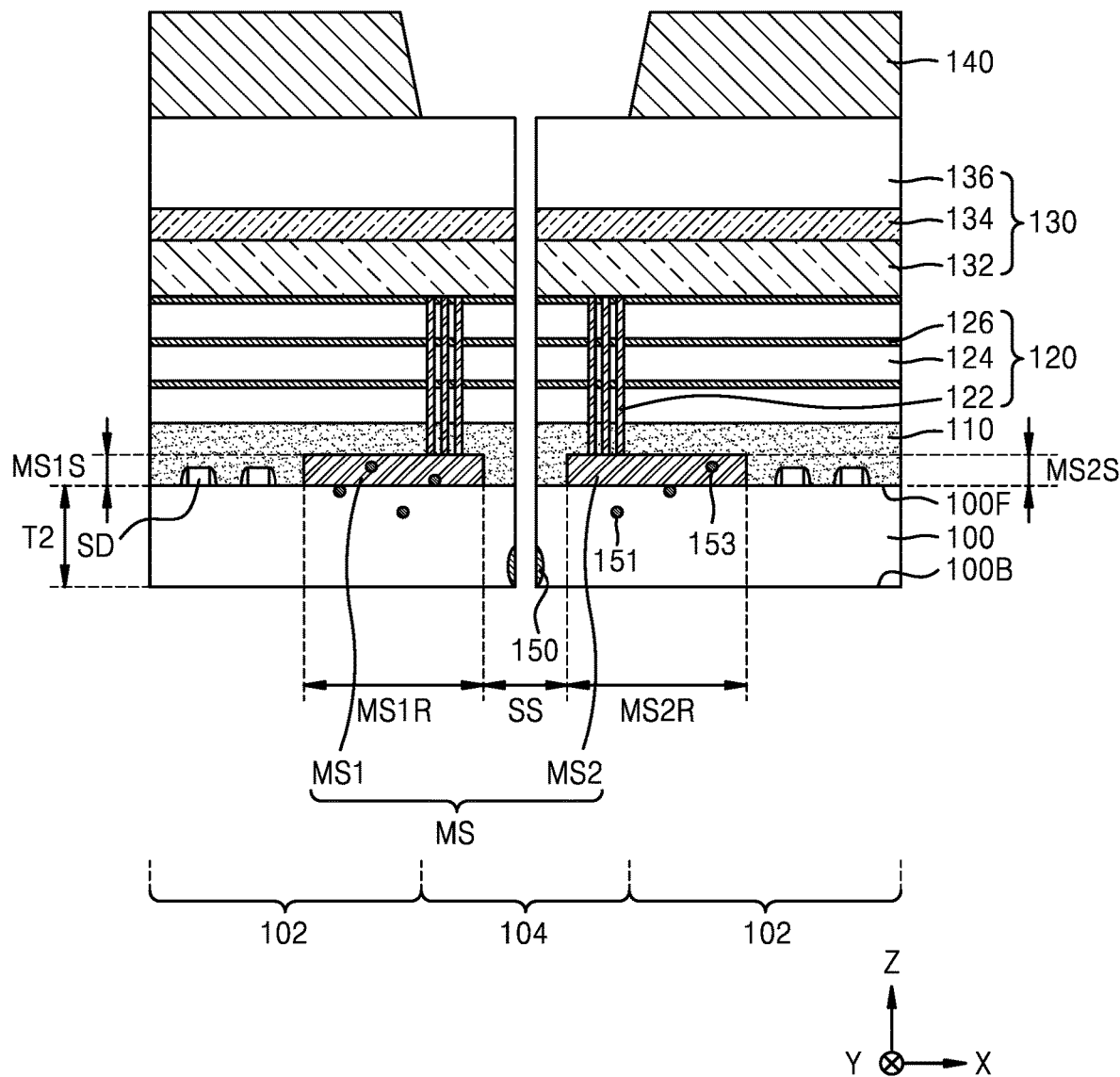
FIG. 11B is a side cross-sectional view corresponding to a surface taken by dicing a center of FIG. 11A in a direction X.

FIG. 10 is a side cross-sectional view showing a state where a semiconductor substrate according to an exemplary embodiment of the disclosure is diced into semiconductor chips, FIG. 11A, which corresponds to FIG. 2A, is an enlarged plane view of a region A illustrated in FIG. 10, and FIG. 11B is a side cross-sectional view corresponding to a surface taken by dicing a center of FIG. 11A in a direction X.

Referring to FIGS. 10, 11A and 11B together, the semiconductor substrate 100 may be separated into the semiconductor chips 10 by a dicing process.

More specifically, in the semiconductor substrate 100, the integrated circuit regions 102 may be separated into the semiconductor chips 10 by the crack (CR of FIG. 9B) in the dicing region 104. The separated semiconductor chips (10 of FIG. 10) may be fixed in an original location without leaving the original location, by the protective sheet 200.

A method of dicing the semiconductor substrate 100 according to the disclosure may form the metal shield layer MS across the integrated circuit regions 102 and the dicing region 104 of the semiconductor substrate 100, thereby preventing leaking or scattered laser from affecting the semiconductor device and reducing the width of the dicing region 104.

In other words, in the method of dicing the semiconductor substrate 100 using laser, an influence of leakage or scattering of the laser may be removed by the metal shield layer MS, thereby preventing a fault such as a function failure of the semiconductor device.

Eventually, a fault of the semiconductor chip 10 diced by the method of dicing the semiconductor substrate 100 may be reduced, and electrical characteristics and productivity of the semiconductor chip 10 may be improved.

Figure 12A:
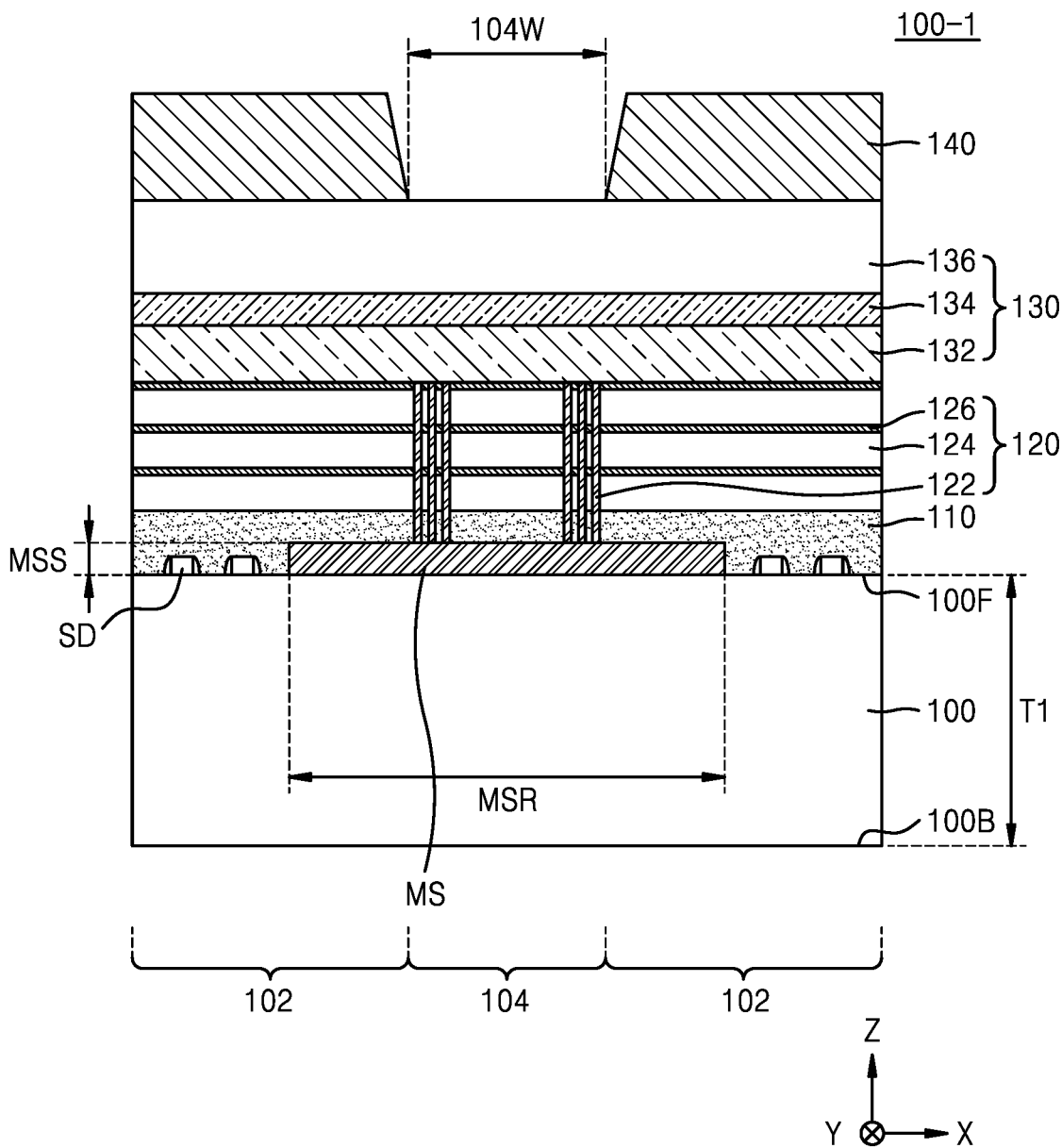
Figure 12B:
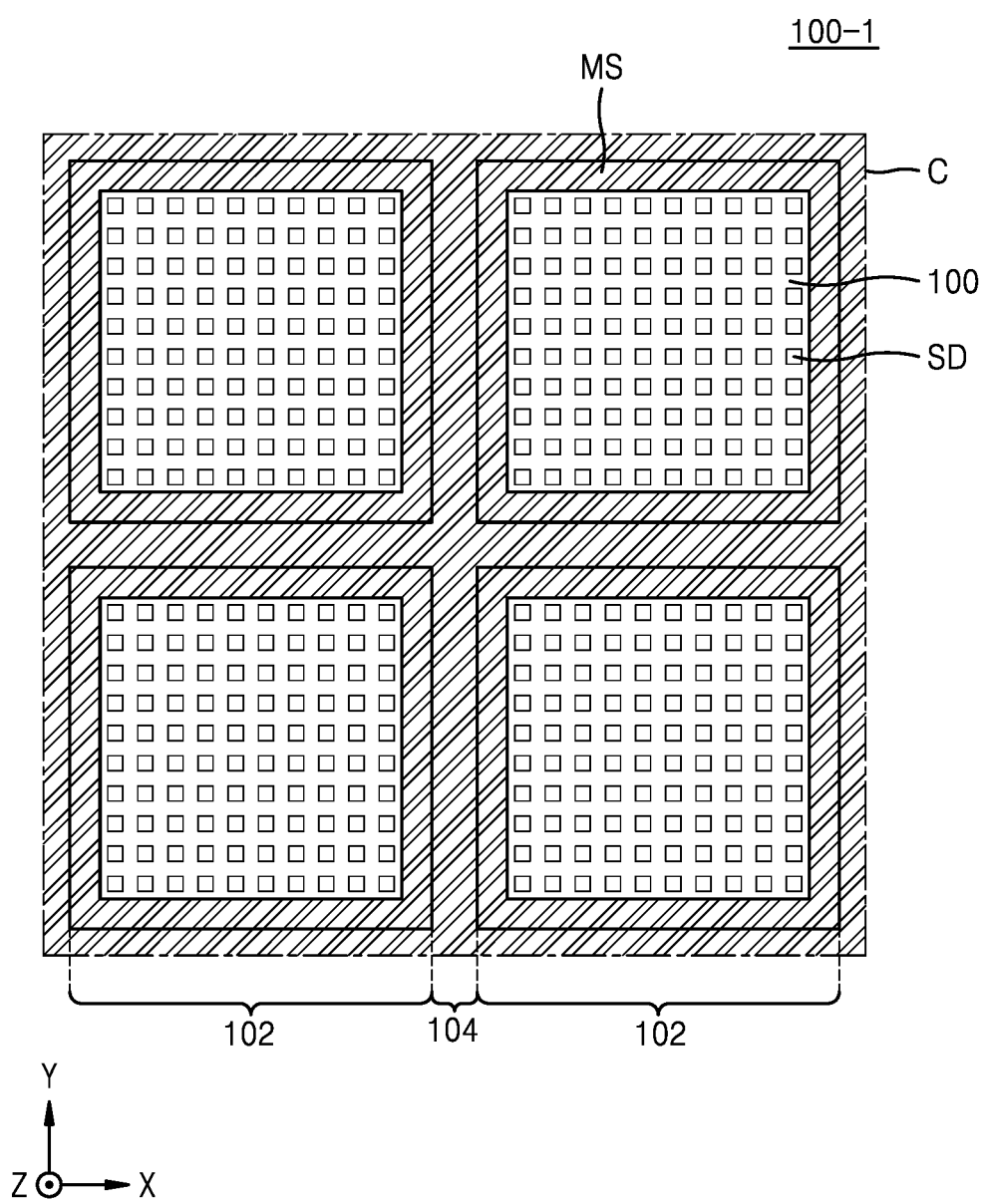

FIGS. 12A and 12B illustrate a semiconductor substrate according to another exemplary embodiment of the disclosure, in which FIG. 12A is an enlarged side cross-sectional view of a region A illustrated in FIG. 1 and FIG. 12B is an enlarged plane view of a region C illustrated in FIG. 1.

Hereinbelow, many components of a semiconductor substrate 100-1 and materials of the components are substantially the same as or similar to a description made with reference to FIGS. 1, 2A, 2B and 2C. Thus, for convenience, a description will be described based on differences than the semiconductor substrate (100 of FIG. 1) described above.

Referring to FIGS. 12A and 12B, the semiconductor substrate 100-1 may include the metal shield layer MS continuing across the adjacent integrated circuit regions 102 with the dicing region 104 therebetween.

The metal shield layer MS may be formed on the active surface 100F of the semiconductor substrate 100 across the adjacent integrated circuit regions 102 and the dicing region 104. The metal shield layer MS may prevent a spot generated due to leakage or scattering of laser in a dicing process from spreading to the integrated circuit regions 102.

A bottom surface of the metal shield layer MS may be arranged to directly contact the active surface 100F. In other words, the metal shield layer MS may be formed in an MEOL process. Thus, in the integrated circuit regions 102 of the semiconductor substrate 100, the semiconductor device SD may not be arranged in a location where the metal shield layer MS is formed.

In a side cross-section view, the metal shield layer MS may have a major axis MSR in the first direction X that is parallel to the active surface 100F and a minor axis MSS in the third direction Z that is perpendicular to the active surface 100F.

A length of the major axis MSR may be about 100 μm to about 200 μm, and a length of the minor axis MSS may be about 0.5 μm to about 1 μm. Describing the above example as a ratio, a ratio of the length of the major axis MSR to the length of the minor axis MSS may be about 100:1 to about 400:1.

That is, the metal shield layer MS may be formed as a thin flat plate-type structure to cover the semiconductor substrate 100.

In a side cross-section view, a propagation direction of a crack (CR of FIG. 9B) and a major-axial direction of the metal shield layer MS may be perpendicular to each other. That is, the propagation direction of the crack (CR of FIG. 9B) may be the third direction Z, and the major-axial direction of the metal shield layer MS may be the first direction X. In a dicing process, the crack (CR of FIG. 9B) may penetrate a central portion of the metal shield layer MS located in the dicing region 104.

In a plane view, the metal shield layer MS may include integrated metal in a hollow lattice shape in each of adjacent integrated circuit regions 102, covering the active surface 100F corresponding to the dicing region 104. The metal shield layer MS may be arranged to allow the crack (CR of FIG. 9B) to pass through the metal shield layer MS. In other words, the metal shield layer MS may be arranged to surround a semiconductor chip (10 of FIG. 10).

A material of the metal shield layer MS may be metal having a melting point of about 600° C. or higher. To prevent the metal shield layer MS from being melted, the metal shield layer MS may include metal having a melting point higher than a temperature of a portion of the semiconductor substrate 100 heated by laser. In some exemplary embodiments of the disclosure, the metal shield layer MS may include aluminum (a melting point of about 660° C.).

Figure 13:
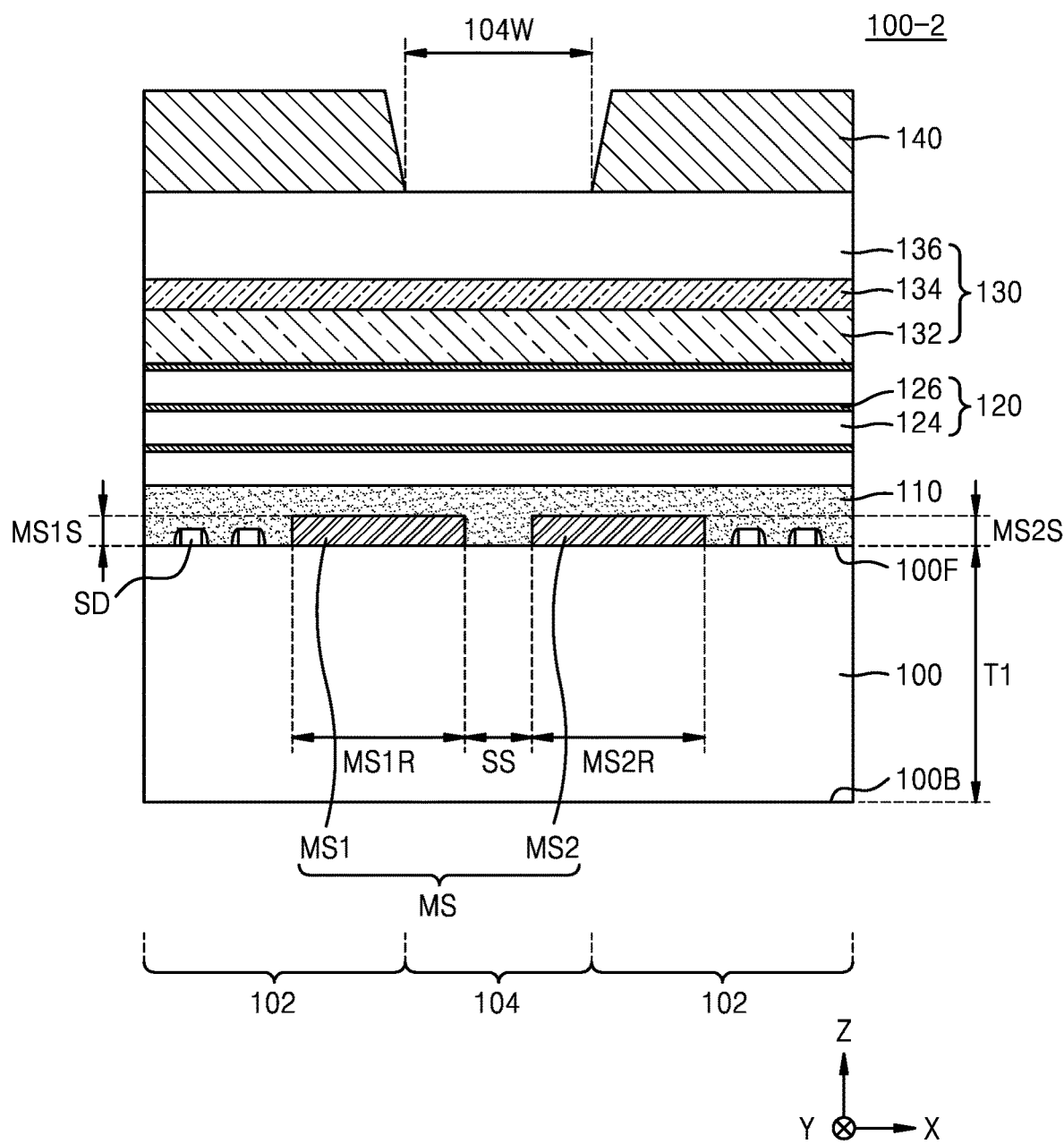

FIG. 13 illustrates a semiconductor substrate according to another exemplary embodiment of the disclosure, in which FIG. 13 is an enlarged side cross-sectional view of a region A illustrated in FIG. 1;

Hereinbelow, many components of a semiconductor substrate 100-2 and materials of the components are substantially the same as or similar to a description made with reference to FIGS. 1 through 2C. Thus, for convenience, a description will be described based on differences than the semiconductor substrate (100 of FIG. 1) described above.

Referring to FIG. 13, a semiconductor substrate 100-2 may include the integrated circuit regions 102 and the dicing region 104, without including a plurality of metal vertical structures.

The multi-layer wires 120 may be formed from a top surface of the semiconductor device layer 110 to a bottom surface of an upper material film 130. The multi-layer wires 120 may include an inter-layer insulating film 124 and a metal wire 126 that are arranged alternately.

The metal wire 126 may include a conductive material including at least one of aluminum (Al), copper (Cu), nickel (Ni), tungsten (W), platinum (Pt), and gold (Au).

The inter-layer insulating film 124 may include a low dielectric material. The low dielectric material, which has a lower dielectric constant than that of a silicon oxide, may be useful for high integration and high speed of the semiconductor device SD when the low dielectric material is used as the inter-layer insulating film 124 in the semiconductor device SD.

In some exemplary embodiments of the disclosure, the inter-layer insulating film 124 may be formed to have a structure in which a first inter-layer insulating film, a second inter-layer insulating film, and a third inter-layer insulating film are sequentially stacked with the metal wire 126 thereamong. However, the number of films of the inter-layer insulating film 124 is not limited to the above-described example. The inter-layer insulating film 124 may be formed to fill the peripheries of the plurality of metal vertical structures 122 and the metal wire 126.

The metal shield layer MS may be formed on the active surface 100F of the semiconductor substrate 100 across the integrated circuit regions 102 and the dicing region 104. The metal shield layer MS may prevent a spot generated due to leakage or scattering of laser in a dicing process from spreading to the integrated circuit regions 102.

In a side cross-section view, the metal shield layer MS may include a first metal shield layer MS1 and a second metal shield layer MS2 with a space region SS of a first interval therebetween in the dicing region 104. In terms of locations, the first metal shield layer MS1 may be referred to as a left metal shield layer and the second metal shield layer MS2 may be referred to as a right metal shield layer. The first interval of the space region SS may be narrower than the width 104W of the dicing region 104.

Figure 14:
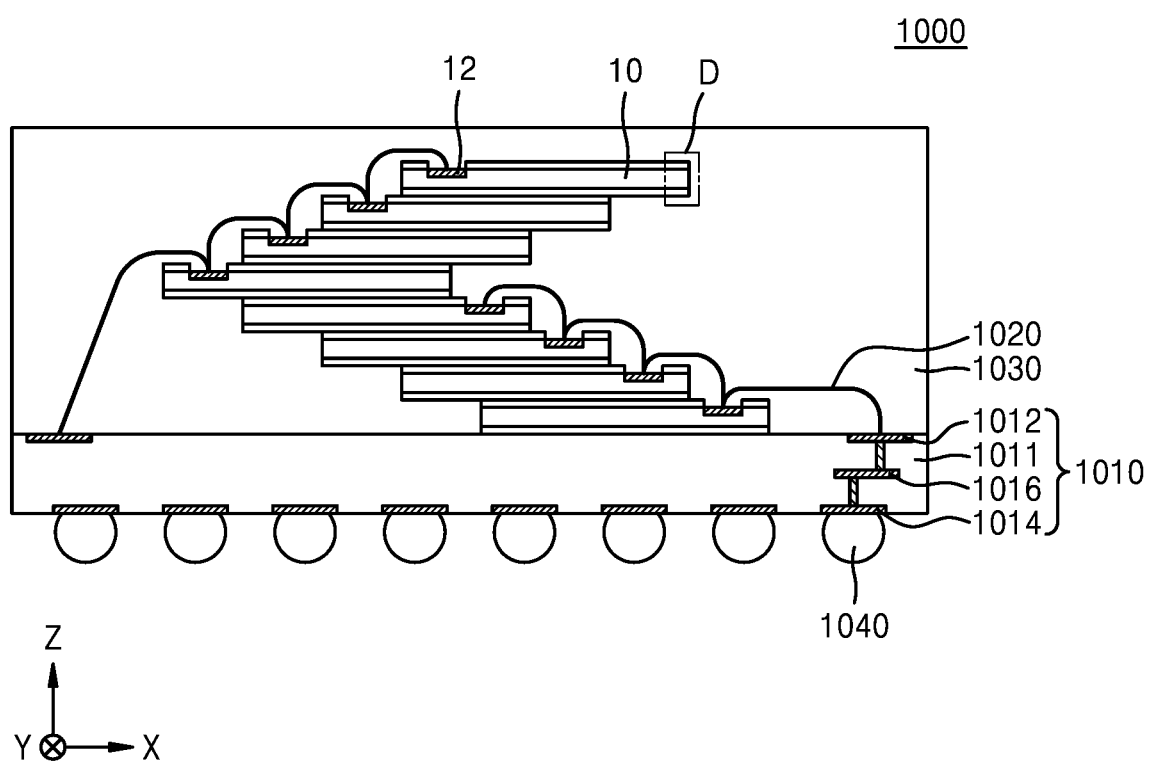
FIG. 14 is a side cross-sectional view illustrating a semiconductor package including semiconductor chips diced from a semiconductor substrate according to an embodiment of the disclosure.
Figure 15A:
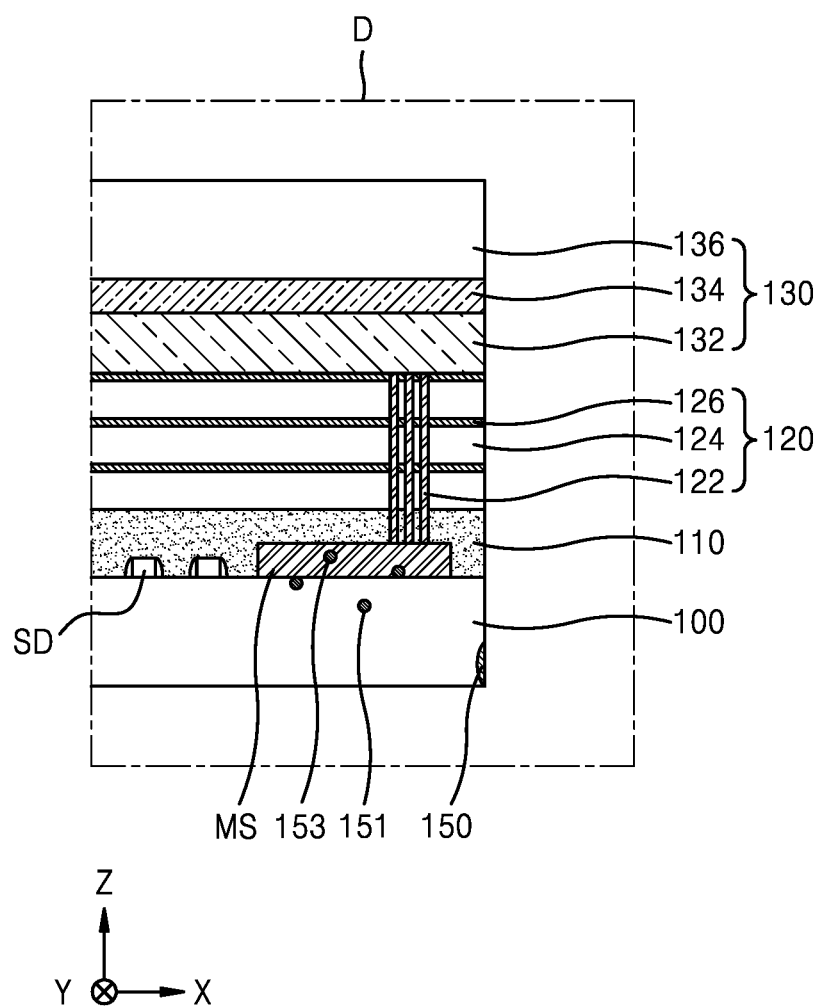
FIG. 15A is an enlarged side cross-sectional view of a portion D illustrated in FIG. 14 according to an embodiment of the disclosure.
Figure 15B:
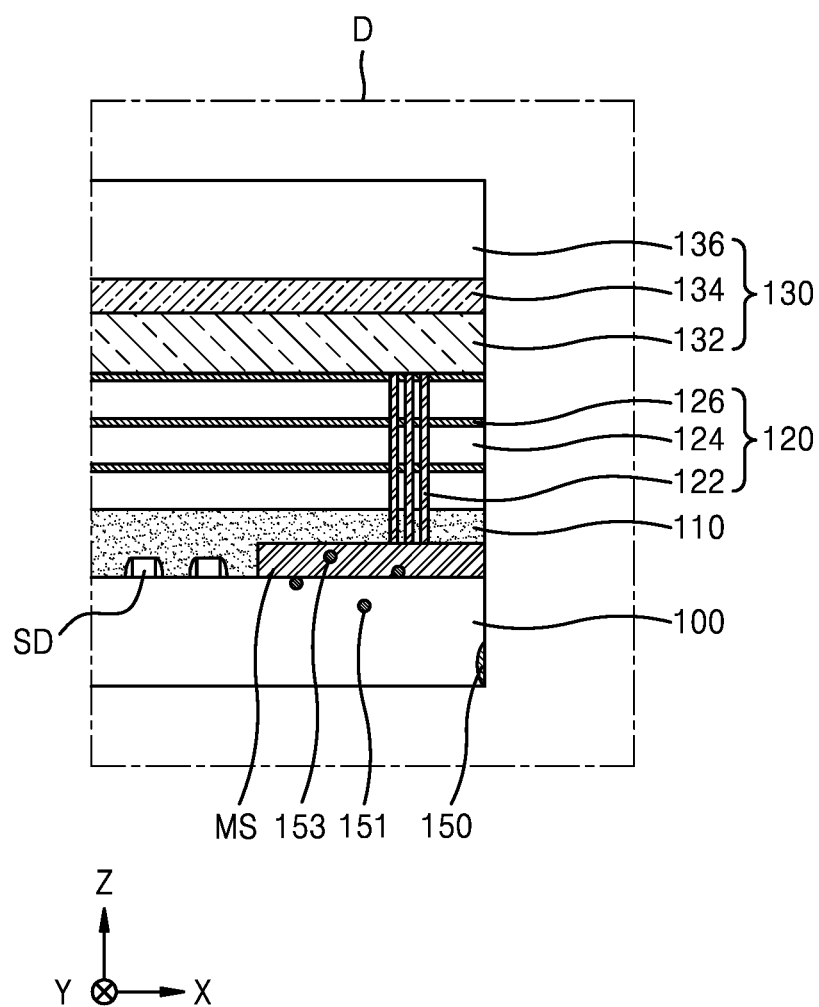
FIG. 15B is an enlarged side cross-sectional view of a portion D illustrated in FIG. 14 according to an embodiment of the disclosure.

FIG. 14 is a side cross-sectional view illustrating a semiconductor package including semiconductor chips diced from a semiconductor substrate according to an exemplary embodiment of the disclosure, FIG. 15A is an enlarged side cross-sectional view of a portion D illustrated in FIG. 14 according to an exemplary embodiment of the disclosure, and FIG. 15B is an enlarged side cross-sectional view of a portion D illustrated in FIG. 14 according to an exemplary embodiment of the disclosure.

Referring to FIG. 14, a semiconductor package 1000 may include a package substrate 1010, the plurality of semiconductor chips 10, a connection member 1020, and a molding member 1030.

The package substrate 1010 as a support substrate may include a body 1011. According to exemplary embodiment, the package substrate 1010 may further include a lower protective layer, and an upper protective layer. The package substrate 1010 may be formed based on a printed circuit board (PCB), a wafer substrate, a ceramic substrate, a glass substrate, an interposer substrate, etc. In an exemplary embodiment of the disclosure, the package substrate 1010 may be a PCB. The package substrate 1010 is not limited to a PCB.

According to an embodiment, a wire 1016 may be formed on the package substrate 1010, and the wire 1016 may be electrically connected to the semiconductor chip 10 through the connection member 1020 connected to the upper electrode pad 1012 on a top surface of the package substrate 1010. An external connection terminal 1040 may be arranged on the lower electrode pad 1014 on a bottom surface of the package substrate 1010. The package substrate 1010 may be mounted in electrical connection with a module substrate or a system board of an electronic product through the external connection terminal 1040.

The multi-layer or single-layer wire, for example, the wire 1016, may be formed in the body 1011, and the semiconductor chip 10 may be electrically connected with the external connection terminal 1040 through the wire 1016. The lower protective layer and the upper protective layer may function to protect the body 1011, and may be formed as, for example, solder resist.

When the package substrate 1010 is a PCB, the body 1011 may be generally implemented by compressing a high-polymer material such as thermoset resin, epoxy-based resin such as flame retardant 4 (FR-4), bismaleimide triazine (BT), an Ajinomoto build up film (ABF), etc., phenol resin, etc., to form a thin film, applying copper foil to opposite sides, and forming the wire 1016 that is a delivery path of an electrical signal through patterning. Except for parts connected with a terminal, e.g., the upper electrode pad 1012 and the lower electrode pad 1014, solder resist may be coated onto a bottom surface and a top surface of the body 1011, thus implementing the lower protective layer and the upper protective layer.

Meanwhile, the PCB may be divided into a single layer PCB in which the wire 1016 is formed only on a single side, and a double layer PCB in which the wire 1016 is formed on opposite sides. The number of layers of the copper foil may be three or more by using an insulator called prepreg, and three or more wires 1016 may be formed based on the number of formed copper foils, thus implementing a PCB having a multi-layer structure. However, the package substrate 1010 is not limited to the above-described structure or material of the PCB.

The plurality of semiconductor chips 10 may be electrically connected to the package substrate 1010 by the connection member 1020. The connection member 1020 may electrically connect the package substrate 1010 and the plurality of semiconductor chips 10 by electrically connecting the upper electrode pad 1012 of the package substrate 1010 with the connection pad 12 of the semiconductor chip 10. In some exemplary embodiments of the disclosure, the connection member 1020 may be a bonding wire.

The connection member 1020 may be used to electrically connect the semiconductor chip with the package substrate 1010. Through the connection member 1020, at least one of a control signal, a power signal, and a ground signal for an operation of the semiconductor chip 10 may be provided from outside, a data signal to be stored in the semiconductor chip 10 may be provided from outside, or data stored in the semiconductor chip 10 may be provided to outside.

The molding member 1030 may protect the plurality of semiconductor chips 10 from an external environment by surrounding the plurality of semiconductor chips 10. The molding member 1030 may be used to inject a proper amount of molding resin onto the package substrate 1010 through an injection process and form an appearance of the semiconductor package 1000 through a hardening process. Depending on a need, in a pressing process, the appearance of the semiconductor package 1000 may be formed by applying pressure to the molding resin. Herein, a processing condition such as a delay time between injection of the molding resin and the pressing, the amount of injection molding resin, and the pressing temperature/pressure, etc., may be set based on physical properties such as viscosity of molding resin.

A side surface and a top surface of the molding member 1030 may have a right-angled shape. In a process of manufacturing the semiconductor package 1000 by dicing the package substrate 1010 along a dicing line, the side surface and the top surface of the molding member 1030 may generally have a right-angled shape. Although not shown, a marking pattern including information of the semiconductor chip 10, e.g., a barcode, a number, a character, a symbol, etc., may be formed in a part of the side surface of the semiconductor package 1000.

In some exemplary embodiments of the disclosure, the molding resin may include epoxy-group molding resin, polyimide-group molding resin, etc. The molding member 1030 may include, for example, an epoxy molding compound (EMC).

The connection pad 12 may be arranged on a semiconductor device layer, and may be electrically connected with a wire layer inside the semiconductor device layer. The wire layer may be electrically connected with the connection member 1020 through the connection pad 12. The connection pad 12 may include at least one of aluminum (Al), copper (Cu), nickel (Ni), tungsten (W), platinum (Pt), and gold (Au).

On the semiconductor device layer may be formed a passivation layer for protecting the semiconductor device layer, the wire layer, and other structures from an external shock or moisture. The passivation layer may expose at least a part of the top surface of the connection pad 12.

The plurality of semiconductor chips 10 constituting the semiconductor package 1000 may have a stacked structure. When eight semiconductor chips 10 are stacked as shown in the figures, four semiconductor chips 10 may form a group and the semiconductor package 1000 may include two groups.

When the four semiconductor chips 10 of a first group are stacked from the bottom layer to the top layer one by one, the semiconductor chips 10 may be stepwisely moved for arrangement in the first direction X to expose the connection pad 12 arranged in each semiconductor chip 10.

The four semiconductor chips 10 of a second group may be stacked on the first group. The four semiconductor chips 10 of the second group may be stepwisely moved for arrangement in the first direction X opposite to a direction in which the first group is moved.

Each semiconductor chip 10 constituting the semiconductor package 1000 may include a semiconductor chip diced from the semiconductor substrate according to the disclosure. In some exemplary embodiments of the disclosure, a semiconductor chip diced from the semiconductor substrate 100 described above may be included as shown in FIG. 15A. In other exemplary embodiments of the disclosure, a semiconductor chip diced from the semiconductor substrate 100-1 described above may be included as shown in FIG. 15B.

Figure 16:
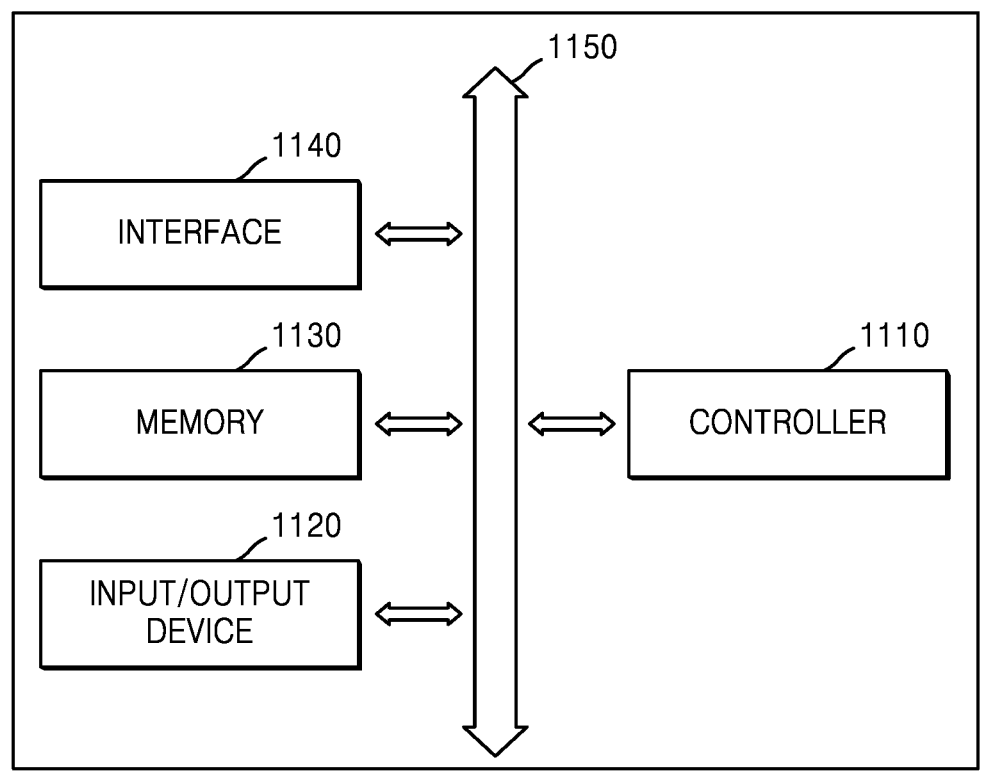
FIG. 16 is a structural diagram showing a system of a semiconductor package including semiconductor chips diced from a semiconductor substrate according to an embodiment of the disclosure.

FIG. 16 is a structural diagram showing a system of a semiconductor package including semiconductor chips diced from a semiconductor substrate according to an exemplary embodiment of the disclosure.

Referring to FIG. 16, a system 1100 may include a controller 1110, an input/output device 1120, a memory 1130, an interface 1140, and a bus 1150.

The system 1100 may be a mobile system or a system that transmits or receives information. In some exemplary embodiments of the disclosure, the mobile system may be a portable computer, a web tablet, a mobile phone, a digital music player, or a memory card.

The controller 1110 is intended to control an execution program in the system 1100, and may include a microprocessor, a digital signal processor, a microcontroller, or a similar device.

The input/output device 1120 may be used to input or output data of the system 1100. The system 1100 may be connected with an external device, e.g., a personal computer (PC) or a network, or exchange data with an external device by using the input/output device 1120. The input/output device 1120 may be, for example, a touch pad, a keyboard, or a display device.

The memory 1130 may store data for an operation of the controller 1110 or data processed in the controller 1110. The memory 1130 may include a semiconductor chip diced from the semiconductor substrate according to the disclosure.

The interface 1140 may be a data transmission path between the system 1100 and the external device. The controller 1110, the input/output device 1120, the memory 1130, the interface 1140 may communicate with one another through a bus 1150.

While one or more aspects of the disclosure has been particularly shown and described with reference to exemplary embodiments thereof, it will be understood that various changes in form and details may be made therein without departing from the spirit and scope of the following claims.

What is claimed is:

1. A method of dicing a semiconductor wafer, the method comprising:
providing a semiconductor substrate having a plurality of integrated circuit regions on an active surface of the semiconductor substrate, a dicing region provided between adjacent integrated circuit regions of the plurality of integrated circuit regions, and a metal shield layer provided on the active surface across at least a portion of the adjacent integrated circuit regions and the dicing region;
forming a modified layer by irradiating laser to an inside of the semiconductor substrate along the dicing region;
propagating a crack from the modified layer in a direction perpendicular to a major-axial direction of the metal shield layer by polishing an inactive surface opposing the active surface of the semiconductor substrate; and
forming semiconductor chips by separating the adjacent integrated circuit regions, respectively, based on the crack propagating from the modified layer,
wherein the method comprises forming a plurality of vertical metal structures directly on the metal shield layer, the plurality of vertical metal structures extending in a minor-axial direction that is perpendicular to the active surface,
wherein, prior to the dicing, the metal shield layer is a continuous thin flat plate-type structure having a bottom side surface in direct contact with an upper surface of the semiconductor substrate, and all other side surfaces in direct contact with a semiconductor device layer formed on the semiconductor substrate, except for a portion of one of the side surface contacting the plurality of vertical metal structures, and
wherein the plurality of vertical metal structures continuously extend in the minor-axial direction through a plurality of dielectric layers and metal wiring layers.

2. The method of claim 1, wherein,
the forming of the modified layer by irradiating the laser comprises preventing a spot generated due to leakage or scattering of the laser from spreading to the adjacent integrated circuit regions using the metal shield layer.

3. The method of claim 1, wherein,
in the providing of the semiconductor substrate, a bottom surface of the metal shield layer is arranged to directly contact the active surface.

4. The method of claim 1, wherein
the adjacent integrated circuit regions include a first integrated circuit region and a second integrated circuit region that are adjacent to each other,
the metal shield layer comprises a first metal shield layer corresponding to the first integrated circuit region and a second metal shield layer corresponding to the second integrated circuit region,
the first metal shield layer and the second metal shield layer are spaced apart from each other by a first interval, and
the first interval is less than a width of the dicing region.

5. The method of claim 4, wherein
each of the first metal shield layer and the second metal shield layer includes a major axis that is parallel to the active surface and a minor axis that is perpendicular to the active surface, and
a ratio of a length of each of the first metal shield layer and the second metal shield layer in the major axis to a length of each of the first metal shield layer and the second metal shield layer in the minor axis is about 50:1 to about 200:1.

6. The method of claim 1, wherein,
in a planar view, the metal shield layer is continuous across the adjacent integrated circuit regions with the dicing region therebetween, and
the crack penetrates the metal shield layer located in the dicing region.

7. The method of claim 6, wherein
the metal shield layer covers the active surface corresponding to the dicing region.

8. The method of claim 1, wherein,
in the providing of the semiconductor substrate, the metal shield layer includes single metal, and
a melting point of material forming the metal shield layer is higher than about 600° C.

9. The method of claim 1, wherein
the semiconductor substrate is provided to include a plurality of metal vertical structures for inducing propagation of the crack are arranged on the metal shield layer.

10. The method of claim 9, wherein,
in a planar view, the direction of the crack and a major-axial direction of each of the plurality of metal vertical structures are parallel to each other.

11. The method of claim 1, wherein the plurality of dielectric layers and metal wiring layers form a stacked layer including a plurality of inter-layer insulating film and a plurality of metal wires alternatively arranged.

12. A method of dicing a semiconductor wafer, the method comprising:
providing a semiconductor substrate having a plurality of integrated circuit regions on an active surface of the semiconductor substrate, a dicing region provided between adjacent integrated circuit regions of the plurality of integrated circuit regions, and a metal shield layer formed on the active surface across at least a portion of the integrated circuit regions and the dicing region;
forming a modified layer by irradiating laser to an inside of the semiconductor substrate along the dicing region;
propagating a crack from the modified layer in a direction perpendicular to a major-axial direction of the metal shield layer by polishing an inactive surface opposing the active surface of the semiconductor substrate; and
forming semiconductor chips by separating the adjacent integrated circuit regions, respectively, based on the crack propagating from the modified layer,
wherein, in a cross-sectional view, the metal shield layer includes a first metal shield layer and a second metal shield layer with a space region therebetween in a location where the crack propagates,
each of the first metal shield layer and the second metal shield layer includes a major axis that is parallel to the active surface and a minor axis that is perpendicular to the active surface in the cross-sectional view, and
a length of the major axis is about 50 µm to about 100 µm, and a length of the minor axis is about 0.5 µm to about 1 µm,
wherein the method comprises forming a plurality of vertical metal structures directly on the metal shield layer, the plurality of vertical metal structures extending in a minor-axial direction that is perpendicular to the active surface, and
wherein, prior to the dicing, the metal shield layer is a continuous thin flat plate-type structure having a bottom side surface in direct contact with an upper surface of the semiconductor substrate, and all other side surfaces in direct contact with a semiconductor device layer formed on the semiconductor substrate, except for a portion of one of the side surface contacting the plurality of vertical metal structures, and
wherein the plurality of vertical metal structures continuously extend in the minor-axial direction through a plurality of dielectric layers and metal wiring layers.

13. The method of claim 12, wherein,
the forming of the modified layer by irradiating the laser comprises preventing a spot generated due to leakage or scattering of the laser from spreading to the adjacent integrated circuit regions using the first metal shield layer and the second metal shield layer.

14. The method of claim 12, wherein,
the adjacent integrated circuit regions include a first integrated circuit region and a second integrated circuit region that are adjacent to each other, and
in the forming of the semiconductor chips, in a plane view, the first metal shield layer has a rectangular shape arranged along a circumference of the first integrated circuit region, and the second metal shield layer has a rectangular shape arranged along a circumference of the second integrated circuit region that is adjacent to the first integrated circuit region.

15. The method of claim 12, wherein,
in the providing of the semiconductor substrate, the first metal shield layer and the second metal shield layer have substantially same shape and same material as each other.

16. The method of claim 15, wherein
the first metal shield layer and the second metal shield layer include aluminum.

* * * * *